(12) United States Patent
Yi

(10) Patent No.: US 12,349,569 B2
(45) Date of Patent: Jul. 1, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Hong Yi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/753,214

(22) PCT Filed: Mar. 30, 2021

(86) PCT No.: PCT/CN2021/083856
§ 371 (c)(1),
(2) Date: Feb. 23, 2022

(87) PCT Pub. No.: WO2022/204921
PCT Pub. Date: Oct. 6, 2022

(65) Prior Publication Data
US 2024/0040866 A1  Feb. 1, 2024

(51) Int. Cl.
*H10K 59/131* (2023.01)
(52) U.S. Cl.
CPC .................. *H10K 59/131* (2023.02)

(58) Field of Classification Search
CPC .................................................. H10K 59/131
See application file for complete search history.

(56) References Cited

U.S. PATENT DOCUMENTS

2008/0174712 A1   7/2008  Kim et al.
2016/0172285 A1*  6/2016  Yang ................ H01L 25/072
                                                             257/675

(Continued)

FOREIGN PATENT DOCUMENTS

CN   106647071 A    5/2017
CN   108957885 A   12/2018

(Continued)

OTHER PUBLICATIONS

English Translation of CN 107331294 (Year: 2017).*

*Primary Examiner* — Patrick N Edouard
*Assistant Examiner* — Eboni N Giles
(74) *Attorney, Agent, or Firm* — McCoy Russell LLP

(57) ABSTRACT

A display substrate includes a display region and a non-display region surrounding the display region. The display substrate further includes: a plurality of scanning lines, a plurality of data lines, and a plurality of data fanout lines, at least a part of each data fanout line being located at the non-display region. Each data fanout line is coupled to a corresponding data line, the plurality of data fanout lines includes a plurality of first data fanout lines and a plurality of second data fanout lines, the first data fanout lines are arranged at a same layer, and made of a same material, as the scanning lines, and the second data fanout lines are arranged at a same layer, and made of a same material, as the data lines.

20 Claims, 10 Drawing Sheets

(56) References Cited

U.S. PATENT DOCUMENTS

| | | | |
|---|---|---|---|
| 2020/0027902 A1* | 1/2020 | Chien | H10K 30/82 |
| 2020/0257173 A1 | 8/2020 | Tsuchiya et al. | |
| 2021/0111191 A1 | 4/2021 | Zeng et al. | |
| 2021/0183893 A1 | 6/2021 | Feng | |
| 2021/0335984 A1* | 10/2021 | Liu | G02F 1/136286 |
| 2023/0154374 A1* | 5/2023 | Yi | G09G 3/32 |
| | | | 345/205 |

FOREIGN PATENT DOCUMENTS

| | | | |
|---|---|---|---|
| CN | 109300921 A | 2/2019 | |
| CN | 109407436 A | 3/2019 | |
| CN | 109449169 A | 3/2019 | |
| CN | 110412802 A | 11/2019 | |
| CN | 210349620 U | 4/2020 | |
| CN | 111183390 A | 5/2020 | |
| CN | 111367129 A | 7/2020 | |
| CN | 111916488 A | 11/2020 | |
| WO | WO-2020114053 A1 * | 6/2020 | H01L 27/1218 |

* cited by examiner

DISPLAY SUBSTRATE AND DISPLAY DEVICE

CROSS REFERENCE TO RELATED APPLICATION

The present application is a U.S. National Phase of International Application No. PCT/CN2021/083856 entitled "DISPLAY SUBSTRATE AND DISPLAY DEVICE," and filed on Mar. 30, 2021. The entire contents of the above-listed application are hereby incorporated by reference for all purposes.

TECHNICAL FIELD

The present disclosure relates to the field of display technology, in particular to a display substrate and a display device.

BACKGROUND

Recently, along with the development of the display technology, an Active Matrix Organic Light-Emitting Diode (AMOLED) display panel has become one of the research hotspots in tablet display devices. As compared with a traditional Thin Film Transistor Liquid Crystal Display (TFTLCD), the AMOED display panel has such advantages as more rapid response, higher contrast and larger viewing angle. In addition, along with the development of the display technology, in more and more electronic devices, a size of a frame of the AMOLED display panel is increasingly demanded, and the AMOLED display panel gradually moves toward a narrow frame.

SUMMARY

An objective of the present disclosure is to provide a display substrate and a display device.

In order to achieve the above-mentioned objective, the present disclosure provides the following technical solutions.

In one aspect, the present disclosure provides in some embodiments a display substrate, including a display region and a non-display region surrounding the display region. The display substrate further includes: a plurality of scanning lines, at least a part of each scanning line being located at the display region; a plurality of data lines, at least a part of each data line being located at the display region; and a plurality of data fanout lines, at least a part of each data fanout line being located at the non-display region. Each data fanout line is coupled to a corresponding data line, the plurality of data fanout lines includes a plurality of first data fanout lines and a plurality of second data fanout lines, the first data fanout lines are arranged at a same layer, and made of a same material, as the scanning lines, and the second data fanout lines are arranged at a same layer, and made of a same material, as the data lines.

In a possible embodiment of the present disclosure, orthogonal projections of at least a part of the first data fanout lines onto a base substrate of the display substrate at least partially overlap orthogonal projections of the second data fanout lines onto the base substrate.

In a possible embodiment of the present disclosure, each of at least a part of the first data fanout lines includes a first line segment, each of at least a part of the second data fanout lines includes a second line segment, and an orthogonal projection of the first line segment onto the base substrate coincides with an orthogonal projection of the second line segment onto the base substrate.

In a possible embodiment of the present disclosure, the display substrate further includes a power source line including a first power source layer, and at least a part of the first power source layer is located between the first data fanout lines and the second data fanout lines in a direction perpendicular to a base substrate of the display substrate.

In a possible embodiment of the present disclosure, the power source line further includes a second power source layer coupled to the first power source layer, at least a part of the first power source layer and at least a part of the second power source layer are arranged at the non-display region, the first power source layer and the second power source layer are laminated one on another, and at least a part of the first power source layer is arranged between the second power source layer and the base substrate of the display substrate.

In a possible embodiment of the present disclosure, at least a part of the second data fanout lines is arranged between the first power source layer and the second power source layer in the direction perpendicular to the base substrate of the display substrate.

In a possible embodiment of the present disclosure, the display substrate further includes a conductive connection member, at least a part of the conductive connection member is arranged between the first power source layer and the second power source layer, and the conductive connection member is coupled to the first power source layer and the second power source layer.

In a possible embodiment of the present disclosure, the display substrate includes a first gate metal layer, a second gate metal layer, a first source/drain metal layer and a second source/drain metal layer laminated one on another in a direction away from the base substrate of the display substrate, each scanning line is arranged at a same layer, and made of a same material, as the first gate metal layer, each data line is arranged at a same layer, and made of a same material, as the first source/drain metal layer, the first power source layer is arranged at a same layer, and made of a same material, as the second gate metal layer, the second power source layer is arranged at a same layer, and made of a same material, as the second source/drain metal layer, and the conductive connection member is arranged at a same layer, and made of a same material, as the first source/drain metal layer.

In a possible embodiment of the present disclosure, the power source line includes a positive power source line, the first power source layer includes a first positive power source layer, and the second power source layer includes a second positive power source layer. At least a part of the first positive power source layer extends in a first direction, the first positive power source layer includes a first middle portion and two first end portions, the first middle portion is arranged between the two first end portions in the first direction, the two first end portions are symmetrical relative to a central axis of the display substrate extending in a second direction, and the second direction intersects the first direction. A maximum width of each first end portion in the second direction is smaller than a maximum width of the first middle portion in the second direction.

In a possible embodiment of the present disclosure, each first end portion includes a first target portion having a first width in the second direction, and the first width gradually increases in a direction away from the first middle portion.

In a possible embodiment of the present disclosure, each first end portion further includes a second target portion, the first target portion is arranged between the second target portion and the first middle portion in the first direction, the second target portion has a second width in the second direction, and the second width gradually decreases in the direction away from the first middle portion.

In a possible embodiment of the present disclosure, the non-display region includes a bending region, and an orthogonal projection of the first middle portion onto the base substrate of the display substrate does not overlap an orthogonal projection of the bending region onto the base substrate.

In a possible embodiment of the present disclosure, the second positive power source layer includes a second middle portion and two second end portions, at least a part of the second middle portion is arranged between the two second end portions in the first direction, and the two second end portions are symmetrical relative to the central axis of the display substrate extending in the second direction. An orthogonal projection of each second end portion onto the base substrate of the display substrate at least partially overlaps the orthogonal projection of the first end portion onto the base substrate, and an orthogonal projection of the second middle portion onto the base substrate at least partially overlaps the orthogonal projection of the first middle portion onto the base substrate.

In a possible embodiment of the present disclosure, each second end portion includes a third target portion having a third width in the second direction, and the third width gradually increases in a direction away from the second middle portion.

In a possible embodiment of the present disclosure, each second end portion further includes a fourth target portion, the third target portion is arranged between the fourth target portion and the second middle portion in the first direction, and a width of the fourth target portion in the second direction is equal to a maximum value of the third width.

In a possible embodiment of the present disclosure, each second end portion further includes a fifth target portion, the fourth target portion is arranged between the fifth target portion and the second middle portion in the first direction, the fifth target portion has a fifth width in the second direction, and the fifth width gradually decreases in a direction away from the second middle portion.

In a possible embodiment of the present disclosure, the second middle portion includes: a first transmission member, two ends of which are coupled to the two second end portions respectively; a second transmission member, at least a part of which extends in the first direction, the first transmission member being arranged between the display region and the second transmission member; at least one connection member arranged between the first transmission member and the second transmission member, and coupled to the first transmission member and the second transmission member, an orthogonal projection of the connection member onto the base substrate of the display substrate at least partially overlapping an orthogonal projection of a bending region of the display substrate onto the base substrate; and two first line inlet members, at least a part of each first line inlet member extending in the second direction, the two first line inlet members being coupled to two ends of the second transmission member respectively.

In a possible embodiment of the present disclosure, the conductive connection member includes two first conductive connection members symmetrical relative to the central axis, and each first conductive connection member is coupled to the first end portion and the second end portion.

In a possible embodiment of the present disclosure, each first conductive connection member extends from a lower frame of the display substrate to a side frame of the display substrate.

In a possible embodiment of the present disclosure, an orthogonal projection of each first conductive connection member onto the base substrate overlaps an orthogonal projection of the first end portion onto the base substrate at a first overlapping region, the first conductive connection member is coupled to the first end portion through a first via-hole, and an orthogonal projection of the first via-hole onto the base substrate at least partially overlaps the first overlapping region. The orthogonal projection of the first conductive connection member onto the base substrate overlaps an orthogonal projection of the second end portion onto the base substrate at a second overlapping region, the first conductive connection member is coupled to the second end portion through a second via-hole, and an orthogonal projection of the second via-hole onto the base substrate at least partially overlaps the second overlapping region.

In a possible embodiment of the present disclosure, the first via-hole and the second via-hole are arranged in the first direction.

In a possible embodiment of the present disclosure, the display substrate further includes a plurality of gate driving circuitries and a plurality of first signal lines configured to provide a corresponding signal to a corresponding gate driving circuitry. The orthogonal projection of the first via-hole onto the base substrate is arranged between an orthogonal projection of the plurality of first signal lines onto the base substrate and an orthogonal projection of the plurality of data fanout lines onto the base substrate, and the orthogonal projection of the second via-hole onto the base substrate partially overlaps the orthogonal projections of at least a part of the first signal lines onto the base substrate.

In a possible embodiment of the present disclosure, the power source line includes a negative power source line, the first power source layer includes a first negative power source layer, and the second power source layer includes a second negative power source layer. The first negative power source layer includes two first negative power source patterns symmetrical relative to the central axis, and at least a part of each first end portion is arranged between the display region and the first negative power source pattern.

In a possible embodiment of the present disclosure, each first negative power source pattern includes a sixth target portion and a seventh target portion, the sixth target portion is arranged between the seventh target portion and the central axis, and a width of the sixth target portion in the second direction is greater than the maximum width of the first end portion in the second direction.

In a possible embodiment of the present disclosure, the seventh target portion has a seventh width in the second direction, and the seventh width gradually decreases in a direction away from the central axis.

In a possible embodiment of present disclosure, the second negative power source layer includes: an annular member surrounding the display region and provided with an opening at a lower frame of the display substrate, at least a part of each second end portion being arranged between the annular member and the display region; and two second line inlet members, at least a part of each second line inlet member extending in the second direction, the two second line inlet members being coupled to two ends of the annular member at the opening respectively.

In a possible embodiment of the present disclosure, each second line inlet member is provided with a hole, and an orthogonal projection of the hole onto the base substrate of the display substrate at least partially overlaps an orthogonal projection of a bending region of the display substrate onto the base substrate.

In a possible embodiment of the present disclosure, the conductive connection member includes a second conductive connection member surrounding the display region, provided with an opening at a lower frame of the display substrate, and coupled to the first negative power source layer and the second negative power source layer.

In a possible embodiment of the present disclosure, the second conductive connection member includes an annular portion, two first portions and two second portions. At least a part of the display region is surrounded by the annular portion, two ends of the annular portion are coupled to first ends of the two second portions respectively, second ends of the two second portions are coupled to the two first portions respectively, and the opening of the second conductive connection member is formed between the two first portions. An extension direction of each first portion intersects the first direction and the second direction, an orthogonal projection of the first portion onto the base substrate of the display substrate overlaps an orthogonal projection of the first negative power source layer onto the base substrate at a third overlapping region, the first portion is coupled to the first negative power source layer through a third via-hole, and an orthogonal projection of the third via-hole onto the base substrate at least partially overlaps the third overlapping region. At least a part of each second portion extends in the first direction, an orthogonal projection of the second portion onto the base substrate and/or an orthogonal projection of the annular portion onto the base substrate overlap an orthogonal projection of the second negative power source layer onto the base substrate at a fourth overlapping region, the second portion and/or the annular portion are coupled to the second negative power source layer through a fourth via-hole, and an orthogonal projection of the fourth via-hole onto the base substrate at least partially overlaps the fourth overlapping region.

In a possible embodiment of the present disclosure, an extension direction of the orthogonal projection of the third via-hole onto the base substrate intersects the first direction and the second direction.

In another aspect, the present disclosure provides in some embodiments a display device including the above-mentioned display substrate.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The present disclosure will be described hereinafter in details in conjunction with the embodiments and drawings.

Along with the development of the display technology, in more and more electronic devices, a size of a frame of a display panel is increasingly demanded, and the display panel gradually moves toward a narrow frame. In this regard, it is necessary to reduce a size of a structure of the display panel at the frame in the case of meeting electrical and process requirements, thereby to reduce a width of the frame of the display panel.

As shown in FIGS. 1 to 7, 12 and 15, the present disclosure provides in some embodiments a display substrate, which includes a display region 10 and a non-display region 20 surrounding the display region 10. The display substrate further includes: a plurality of scanning lines 101, at least a part of each scanning line 101 being located at the display region 10; a plurality of data lines 102, at least a part of each data line 102 being located at the display region 10; and a plurality of data fanout lines 21, at least a part of each data fanout line 21 being located at the non-display region 20. Each data fanout line 21 is coupled to a corresponding data line 102, the plurality of data fanout lines 21 includes a plurality of first data fanout lines 210 and a plurality of second data fanout lines 211, the first data fanout lines 210 are arranged at a same layer, and made of a same material, as the scanning lines 101, and the second data fanout lines 211 are arranged at a same layer, and made of a same material, as the data lines 102.

Illustratively, the display substrate includes the display region and the non-display region 20 surrounding the display region 10, and a plurality of subpixels for achieving a display function of the display substrate is arranged in the display region 10. The display substrate includes side frames arranged opposite to each other in a first direction, e.g., a left frame and a right frame, and an upper frame and a lower frame arranged opposite to each other in a second direction. For example, the first direction includes a horizontal direction, and the second direction includes a longitudinal direction.

Figure 7:
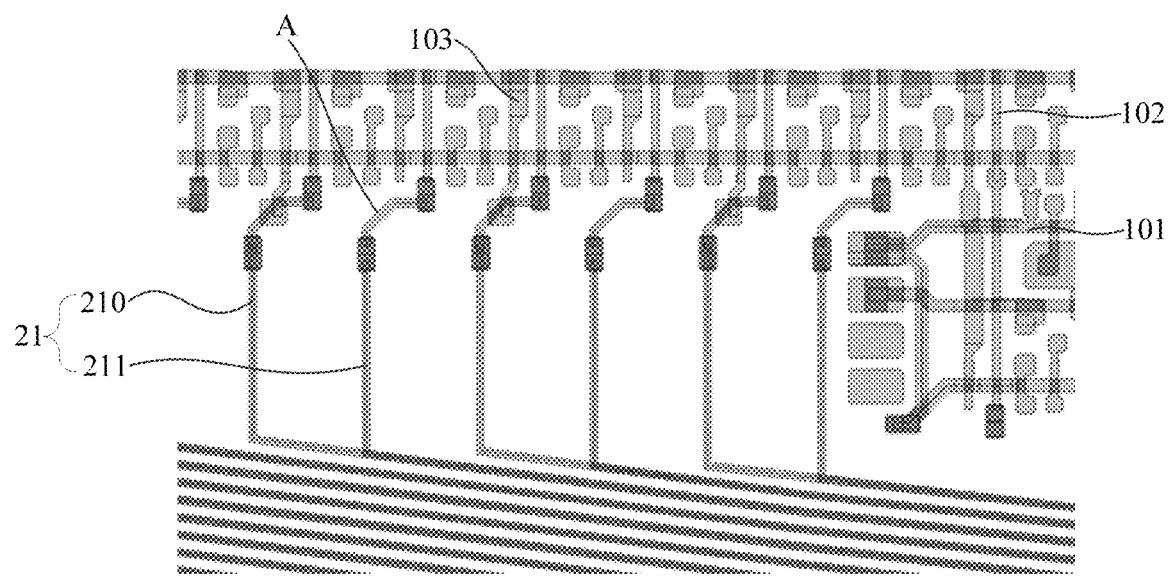
FIG. 7 is still yet another schematic view showing the arrangement of the data fanout lines according to one embodiment of the present disclosure.

As shown in FIG. 7, for example, the plurality of scanning lines 101 is arranged in the second direction, each scanning line 101 includes a portion extending in the first direction, and at least a part of each scanning line 101 is arranged at the display region. Each scanning line 101 is configured to provide a scanning signal to a subpixel driving circuitry 60 of a corresponding subpixel at the display region.

Figure 6:
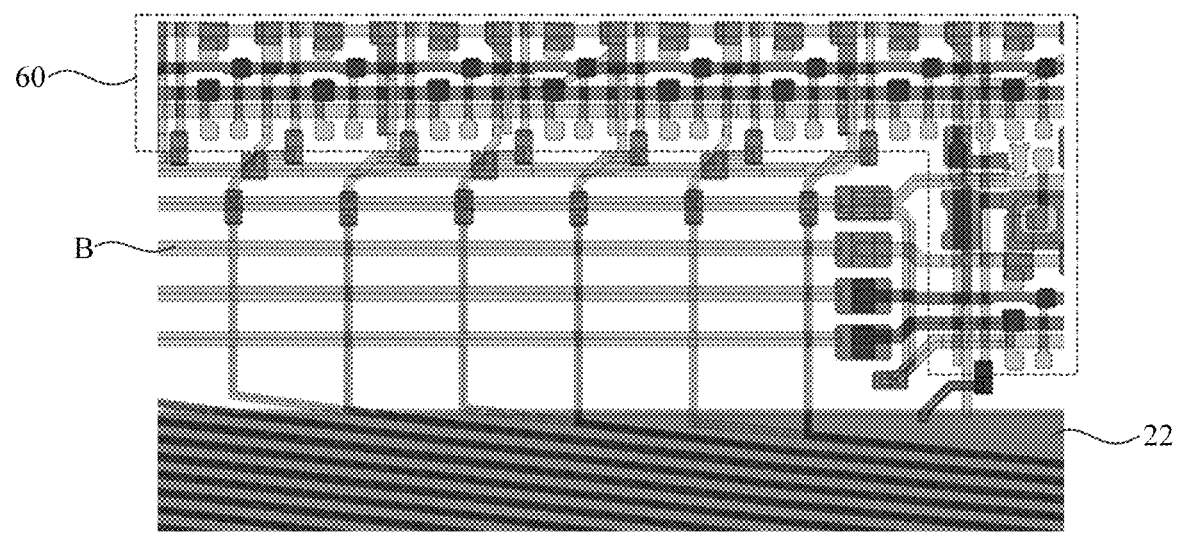
FIG. 6 is yet another schematic view showing the arrangement of the data fanout lines according to one embodiment of the present disclosure.

As shown in FIGS. 6 and 7, for example, the plurality of data lines 102 is arranged in the first direction, each data line 102 includes a portion extending in the second direction, and at least a part of the data line 102 is arranged at the display region. Each data line 102 is configured to provide a data signal to a subpixel driving circuitry 60 of a corresponding subpixel at the display region.

As shown in FIGS. 6 and 7, for example, the plurality of data fanout lines 21 correspond to the plurality of data lines 102 respectively. Each data fanout line 21 is coupled to a corresponding data line 102, and configured to provide a data signal to the corresponding data line 102. For example, the plurality of data fanout lines is arranged at the lower frame of the display substrate. For example, each data fanout line is coupled to the corresponding data line 102 through a conductive member A, and the conductive member A is made of a first gate metal layer.

Figure 4:
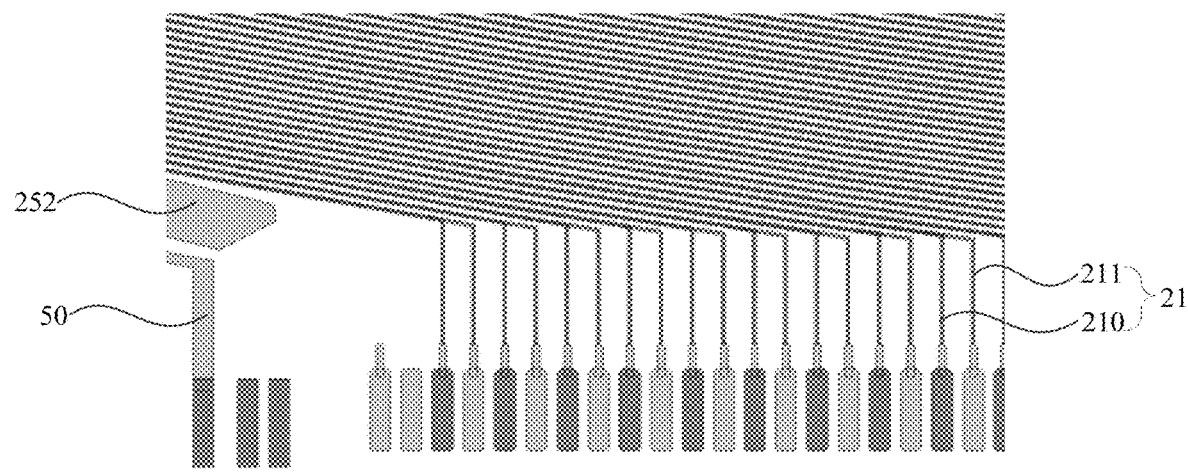
FIG. 4 is another schematic view showing the arrangement of the data fanout lines according to one embodiment of the present disclosure.
Figure 5:
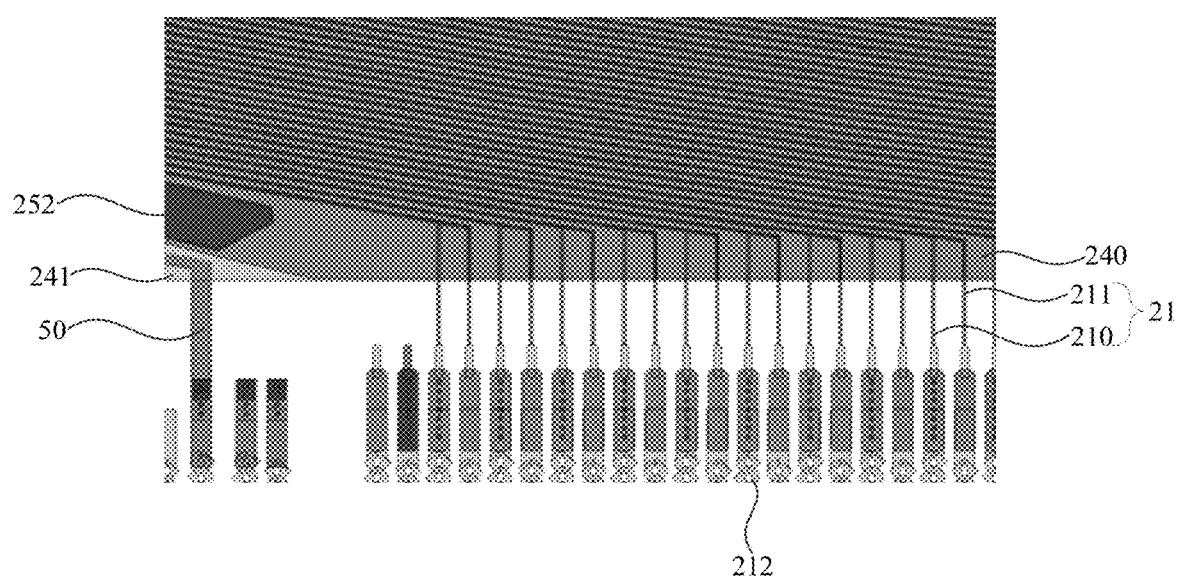
FIG. 5 is a schematic view showing the coupling of the data fanout line to a fanout extension line according to one embodiment of the present disclosure.

As shown in FIGS. 4 and 5, for example, the display substrate further includes a plurality of fanout extension lines 212, and at least a part of the fanout extension lines 212 correspond to the plurality of data fanout lines 21 respectively. Each fanout extension line 212 is coupled to a corresponding data fanout line 21 and a corresponding pin of a driving chip, and configured to transmit a data signal from the driving chip to the corresponding data fanout line 21.

Figure 11:
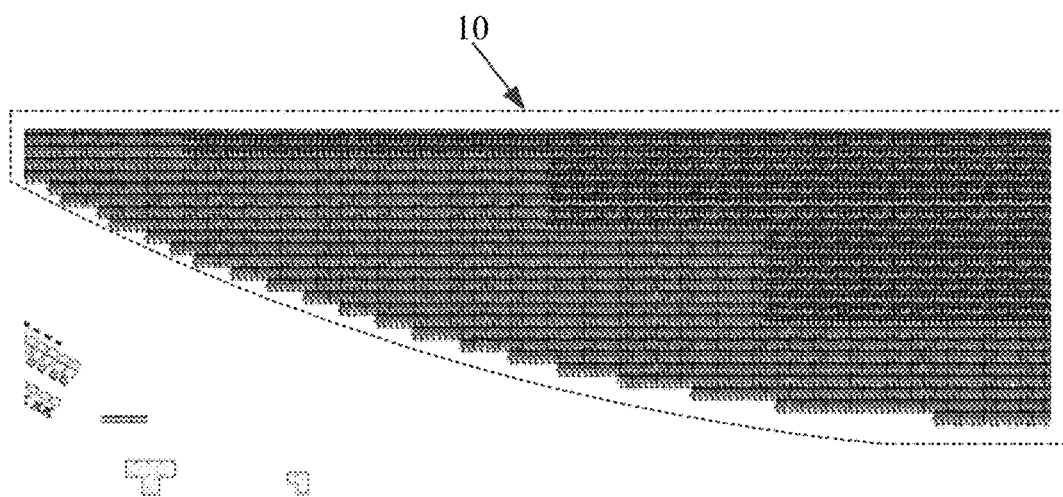
FIG. 11 is a schematic view showing the arrangement of an active layer at the lower left corner of the display substrate according to one embodiment of the present disclosure.
Figure 12:
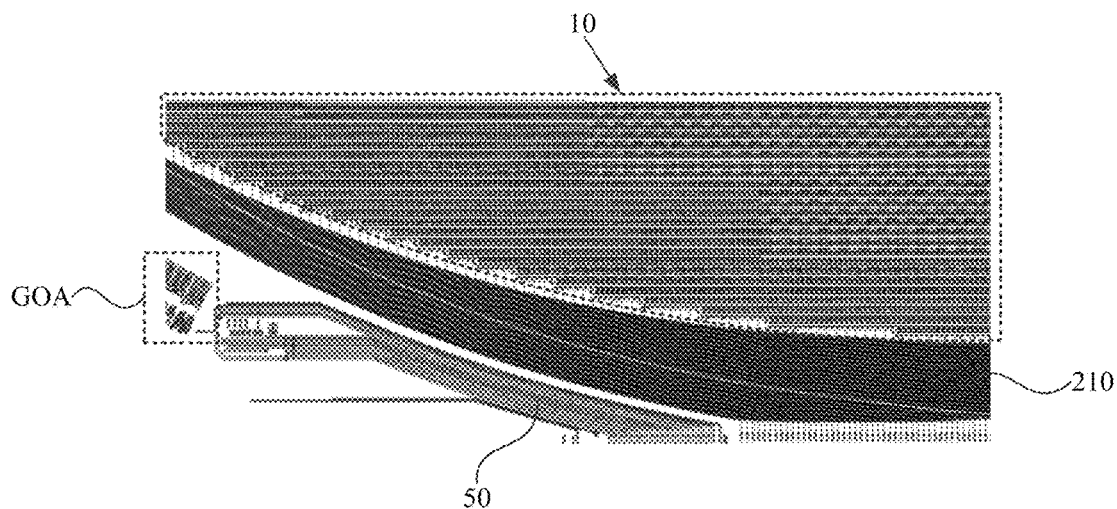
FIG. 12 is a schematic view showing the arrangement of a first gate metal layer at the lower left corner of the display substrate according to one embodiment of the present disclosure.

For example, the display substrate includes a base substrate, and an active layer, a first gate insulation layer, a first gate metal layer, a second gate insulation layer GI2, a second gate metal layer, an interlayer insulation layer ILD, a first source/drain metal layer, a first planarization layer PLN1, a second source/drain metal layer, a second planarization layer, an anode layer, a light-emitting functional layer, and a cathode layer laminated one on another on the base substrate in a direction away from the base substrate. For example, the display substrate further includes a passivation layer PVX arranged between the first source/drain metal layer and the first planarization layer PLN1. It should be appreciated that, FIG. 11 shows the arrangement of the active layer at a lower left corner of the display substrate.

Figure 10:
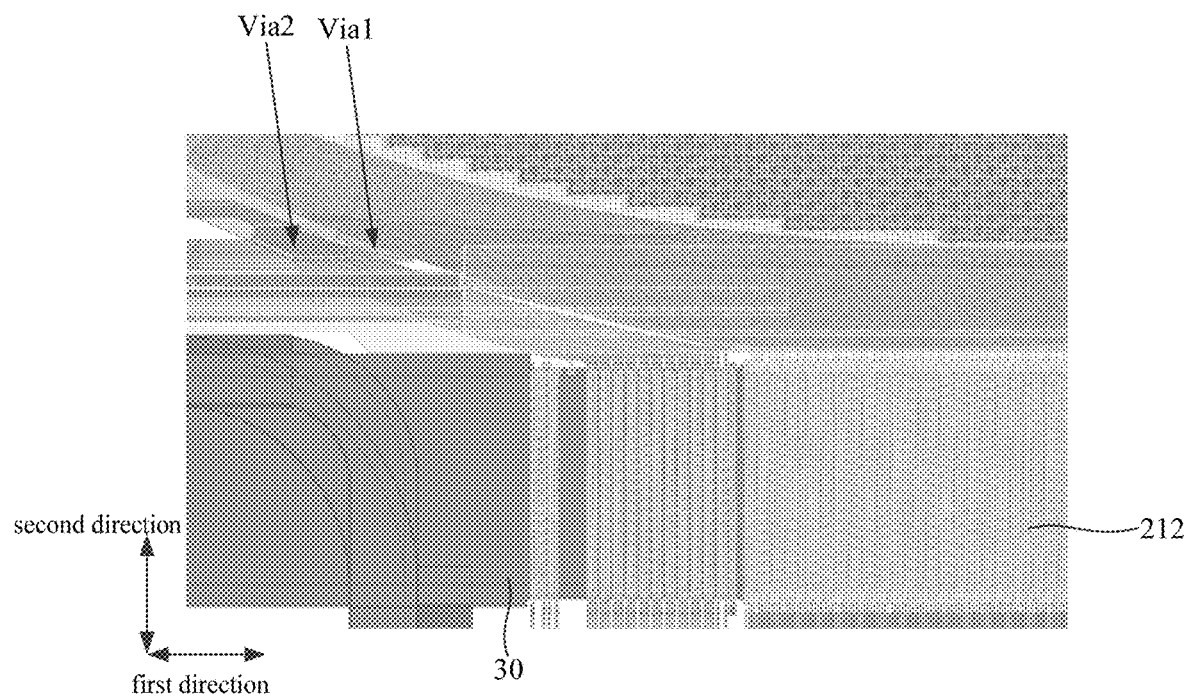
FIG. 10 is another schematic view showing the portion of the display substrate at the lower left corner according to one embodiment of the present disclosure.

As shown in FIG. 10, for example, at least a part of each fanout extension line 212 extends in the second direction. The plurality of fanout extension lines 212 is spaced apart from each other in the first direction, and arranged at a same layer, and made of a same material, as the second source/drain metal layer. An orthogonal projection of each fanout extension line 212 onto the base substrate at least partially overlaps an orthogonal projection of a bending region 30 of the display substrate onto the base substrate. The first planarization layer is arranged immediately close to a side of the second source/drain metal layer facing the base substrate, the second polarization layer is arranged immediately close to a side of the second source/drain metal layer away from the base substrate, the first planarization layer and the second planarization layer are made of an organic material, so the fanout extension line 212 is arranged at a same layer, and made of a same material, as the second source/drain metal layer, so as to ensure the reliability of the fanout extension line 212 at the bending region 30.

For example, the plurality of data fanout lines includes a plurality of first data fanout lines 210 arranged evenly and a plurality of second data fanout lines 211 arranged evenly. The first data fanout lines 210 are arranged at a same layer, and made of a same material, as the scanning lines 101, so that the first data fanout lines 210 and the scanning lines 101 are formed through a single patterning process. Identically, the second data fanout lines 211 are arranged at a same layer, and made of a same material, as the data lines 102, so that the second data fanout lines 211 and the data lines 102 are formed through a single patterning process. In this way, it is able to simplify a manufacture process of the display substrate in a better manner, thereby to reduce the manufacture cost of the display substrate.

As shown in FIGS. 4 and 5, for example, the fanout extension line 212 is arranged at a layer different from the corresponding data line 102 coupled thereto, and directly coupled to the corresponding data line 102 through at least one via-hole. Alternatively, the fanout extension line 212 is coupled to the corresponding data line 102 through at least one via-hole and a conductive member. It should be appreciated that, the fanout extension line 212 is directly coupled to the corresponding second data fanout line 211 through at least one via-hole, and coupled to the corresponding first data fanout line 210 through a via-hole and a conductive member. The conduction member is made of a first source/drain metal layer.

Based on the specific structure of the display substrate, the plurality of data fanout lines includes the plurality of first data fanout lines 210 and the plurality of second data fanout lines 211, the first data fanout lines 210 are arranged at a same layer, and made of a same material, as the scanning lines 101, and the second data fanout lines 211 are arranged at a same layer, and made of a same material, as the data lines 102, so that the first data fanout line 210 is arranged at a layer different from the second data fanout line 211. As a result, through reducing a distance between the orthogonal projection of the first data fanout line 210 onto the base substrate and an orthogonal projection of the second data fanout line 211 onto the base substrate, it is able to reduce an overall space occupied by the plurality of data fanout lines, and reduce an overall width of the plurality of data fanout lines in the second direction, thereby to effectively reduce a width of the lower frame of the display substrate, and improve the competitiveness of a display product including the display substrate.

Figure 3:
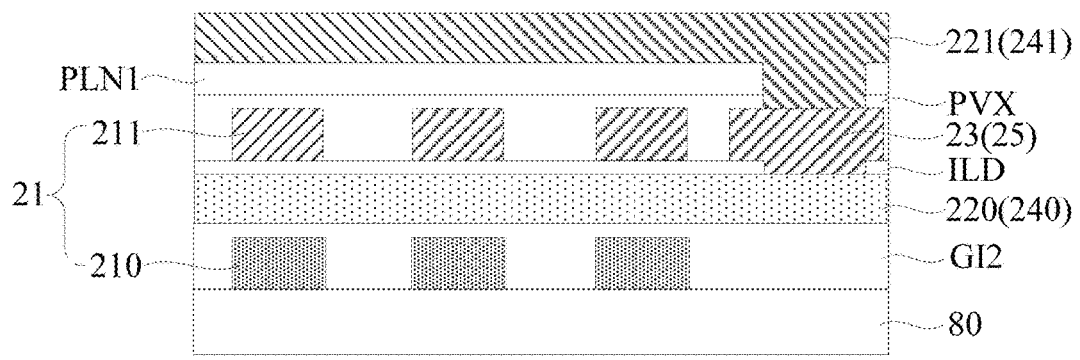
FIG. 3 is a sectional view of the data fanout lines according to one embodiment of the present disclosure.

As shown in FIG. 3, in some embodiments of the present disclosure, orthogonal projections of at least a part of the first data fanout lines 210 onto the base substrate 80 of the display substrate at least partially overlap orthogonal projections of the second data fanout lines 211 onto the base substrate 80.

Based on the above, it is able to reduce the distance between the orthogonal projection of the first data fanout line 210 onto the base substrate and the orthogonal projection of the second data fanout line 211 onto the base substrate, and reduce the overall space occupied by the plurality of data fanout lines, thereby to effectively reduce the width of the lower frame of the display substrate, and improve the competitiveness of the display product including the display substrate.

As shown in FIGS. 2 to 7, in some embodiments of the present disclosure, each of at least a part of the first data fanout lines 210 includes a first line segment, each of at least a part of the second data fanout lines 211 includes a second line segment, and an orthogonal projection of the first line segment onto the base substrate coincides with an orthogonal projection of the second line segment onto the base substrate.

For example, an extension direction of the first line segment intersects the first direction and the second direction.

Based on the above, when the orthogonal projection of the first line segment onto the base substrate coincides with the orthogonal projection of the second line segment onto the base substrate, it is able to prevent a width of the first data fanout line 210 to be different from a width of the second data fanout line 211, further reduce the distance between the orthogonal projection of the first data fanout line 210 onto the base substrate and the orthogonal projection of the second data fanout line 211 onto the base substrate, and reduce the overall space occupied by the plurality of data fanout lines, thereby to effectively reduce the width of the lower frame of the display substrate, and improve the competitiveness of the display product including the display substrate.

As shown in FIGS. 3, 8, 9, 13, 16, 17 and 18, in some embodiments of the present disclosure, the display substrate further includes a power source line including a first power source layer (e.g., a first positive power source layer 220 and a first negative power source layer 240), and at least a part of the first power source layer is located between the first data fanout lines 210 and the second data fanout lines 211 in a direction perpendicular to the base substrate of the display substrate.

For example, an orthogonal projection of the first power source layer onto the base substrate at least partially overlaps the orthogonal projections of the first data fanout lines 210 onto the base substrate, and at least partially overlaps the orthogonal projections of the second data fanout lines 211 onto the base substrate.

Based on the above, when at least a part of the first power source layer is arranged between the first data fanout lines 210 and the second data fanout lines 211, the first data fanout lines 210 are spaced apart from the second data fanout lines 211 through the first power source layer in the direction perpendicular to the base substrate. A static direct current signal is transmitted through the first power source layer, so it is able to effectively reduce crosstalk between the first data fanout lines 210 and the second data fanout lines 211.

As shown in FIGS. 3, 8, 9, 13, 16, 17 and 18, in some embodiments of the present disclosure, the power source line further includes a second power source layer (e.g., a second positive power source layer 221 and a second negative power source layer 241) coupled to the first power source layer. At least a part of the first power source layer and at least a part of the second power source layer are arranged at the non-display region 20, the first power source layer and the second power source layer are laminated one on another, and at least a part of the first power source layer is arranged between the second power source layer and the base substrate of the display substrate.

For example, the power source line includes a positive power source line 22 and a negative power source line 24.

For example, the first power source layer and the second power source layer are laminated one on another, and at least a part of the first power source layer is arranged between the second power source layer and the base substrate of the display substrate in the direction perpendicular to the base substrate.

For example, an orthogonal projection of the first power source layer onto the base substrate at least partially overlaps an orthogonal projection of the second power source layer onto the base substrate.

Based on the above, when the power source line includes the first power source layer and the second power source layer, it is able to effectively increase an area of the power source line, thereby to reduce a loading of a power source signal transmitted on the power source line.

As shown in FIG. 3, in some embodiments of the present disclosure, at least a part of the second data fanout lines 211 is arranged between the first power source layer (e.g., the first positive power source layer 220 and the first negative power source layer 240) and the second power source layer (e.g., the second positive power source layer 221 and the second negative power source layer 241) in the direction perpendicular to the base substrate of the display substrate.

For example, the orthogonal projections of the second data fanout lines 211 onto the base substrate at least partially overlaps the orthogonal projection of the first power source layer onto the base substrate, and the orthogonal projections of the second data fanout lines 211 onto the base substrate at least partially overlaps the orthogonal projection of the second power source layer onto the base substrate.

When at least a part of the second data fanout lines 211 is arranged between the first power source layer and the second power source layer, it is able to reduce the crosstalk between the first data fanout lines 210 and the second data fanout lines 211, and ensure the stability of the data signal transmitted on the second data fanout lines 211.

As shown in FIGS. 8, 9, 15, 17 and 18, in some embodiments of the present disclosure, the display substrate further includes a conductive connection member (e.g., a first conductive connection member 23 and a second conductive connection member 25), at least a part of the conductive connection member is arranged between the first power source layer (e.g., the first positive power source layer 220 and the first negative power source layer 24) and the second power source layer (e.g., the second positive power source layer 221 and the second negative power source layer 241), and the conductive connection member is coupled to the first power source layer and the second power source layer.

For example, an orthogonal projection of the conductive connection member onto the base substrate at least partially overlaps the orthogonal projection of the first power source layer onto the base station, and at least partially overlaps the orthogonal projection of the second power source layer onto the base substrate.

For example, the conductive connection member is arranged at a layer different from the first power source layer and the second power source layer, at least a part of the conductive connection member is arranged between the first power source layer and the second power source layer in the direction perpendicular to the base substrate, and the conductive connection member is coupled to the first power source layer and the second power source layer through corresponding via-holes.

Based on the above, when the display substrate further includes the conductive connection member coupled to the first power source layer and the second power source layer, it is able to ensure connection performance between the first power source layer and the second power source layer in a better manner.

Figure 20:
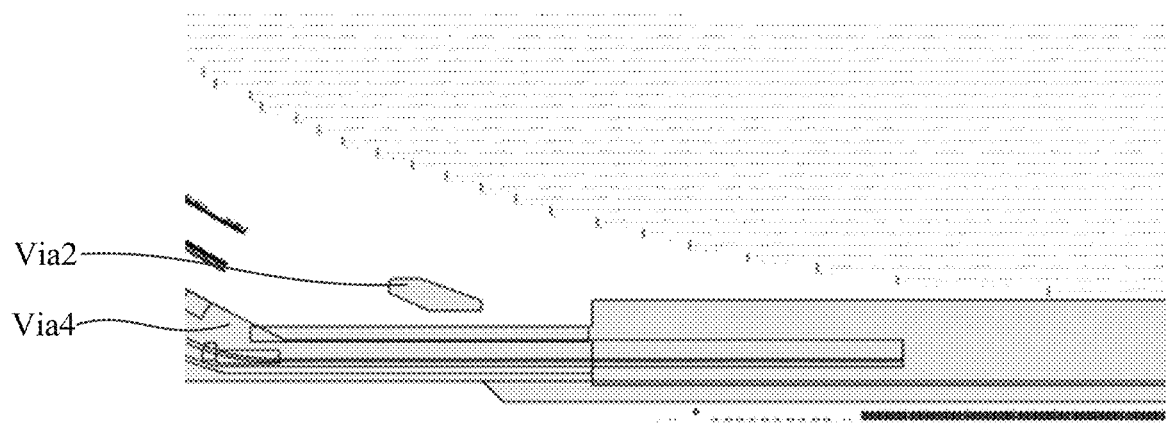
FIG. 20 is a schematic view showing the arrangement of a first planarization layer at the lower left corner of the display substrate according to one embodiment of the present disclosure.

As shown in FIGS. 6, 7 and 20, in some embodiments of the present disclosure, the display substrate includes a first gate metal layer 96, a second gate metal layer 97, a first source/drain metal layer SD1 and a second resource/drain metal layer SD2 laminated one on another in a direction away from the base substrate of the display substrate. The scanning lines 101 are arranged at a same layer, and made of a same material, as the first gate metal layer 96, the data lines 102 are arranged at a same layer, and made of a same material, as the first source/drain metal layer SD1, the first power source layer is arranged at a same layer, and made of a same material, as the second gate metal layer 97, the second power source layer is arranged at a same layer, and made of a same material, as the second source/drain metal layer SD2, and the conductive connection member is arranged at a same layer, and made of a same material, as the first source/drain metal layer SD1.

As shown in FIG. 6, for example, the first gate metal layer 96 includes a gate electrode of a thin film transistor and an electrode plate of a capacitor in the subpixel driving circuitry 60, and the second gate metal layer 97 includes an electrode plate of the capacitor in the subpixel driving circuitry 60 as well as some signal lines of the display substrate. The first source/drain metal layer SD1 includes some signal lines of the display substrate as well as some conductive connection patterns, and the second source/drain metal layer SD2 includes some signal lines of the display substrate and some conductive connection patterns.

Figure 21:
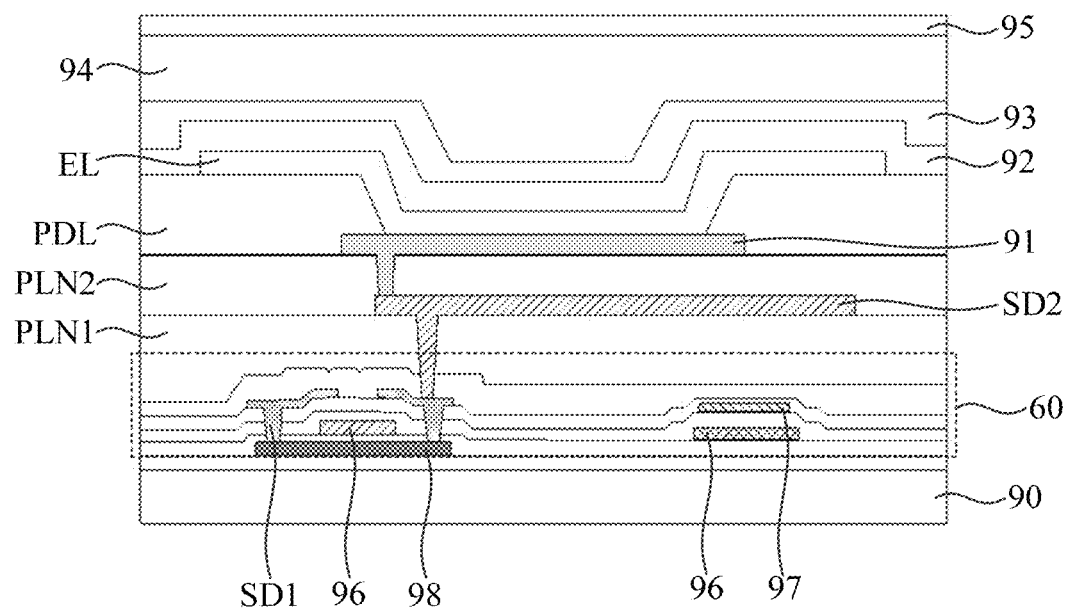
FIG. 21 is a sectional view of a display region of the display substrate according to one embodiment of the present disclosure.

It should be appreciated that, FIG. 21 further shows the base substrate 90, an active layer 98, a first planarization layer PLN1, a second planarization layer PLN2, a pixel definition layer PDL, an anode layer 91, a light-emitting functional layer EL, a cathode layer 92, a first inorganic encapsulation layer 93, an organic encapsulation layer 94 and a second inorganic encapsulation layer 95.

When the scanning lines 101 are arranged at a same layer, and made of a same material, as the first gate metal layer 96, it is able to form the scanning lines 101 and the first gate metal layer 96 through a single patterning process. When the data lines 102 are arranged at a same layer, and made of a same material, as the first source/drain metal layer SD1, it is able to form the data lines 102 and the first source/drain metal layer SD1 through a single patterning process. When the first power source layer is arranged at a same layer, and made of a same material, as the second gate metal layer 97, it is able to form the first power source layer and the second gate metal layer 97 through a single patterning process. When the second power source layer is arranged at a same layer, and made of a same material, as the second source/drain metal layer SD2, it is able to form the second power source layer and the second source/drain metal layer SD2 through a single patterning process. When the first conductive connection member 23 is arranged at a same layer, and made of a same material, as the first source/drain metal layer SD1, it is able to form the first conductive connection member 23 and the first source/drain metal layer SD1 through a single patterning process. Hence, based on the above, it is able to effectively simply the manufacture process of the display substrate, thereby to reduce the manufacture cost of the display substrate.

It should be appreciated that, the expression "at a same layer" refers to that the film layers are arranged on a same structural layer. Alternatively, for example, the film layers on a same layer may be layer structures formed through forming thin layers for forming specific patterns through a single film-forming process and then patterning the film layers with a same mask through a single patterning process. Depending on different specific patterns, a single patterning process may include multiple exposure, development or etching processes, and the specific patterns in the layer structures may be continuous or discontinuous. These specific patterns may also be arranged at different levels or have different thicknesses.

Figure 8:
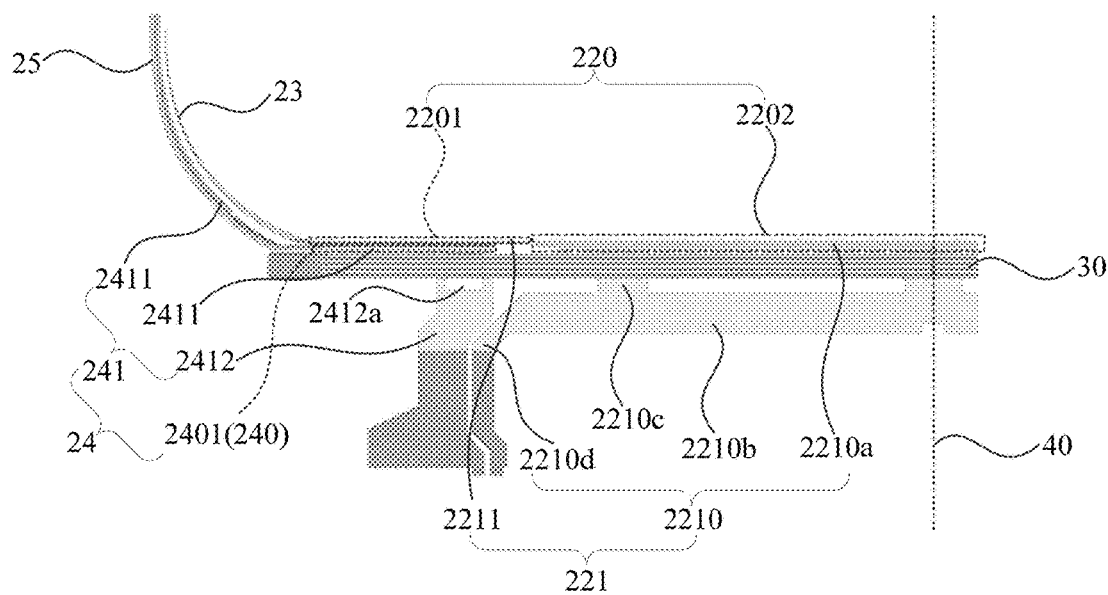
FIG. 8 is a schematic view showing portions of a positive power source line and a negative power source line at a lower left corner of the display substrate according to one embodiment of the present disclosure.
Figure 9:
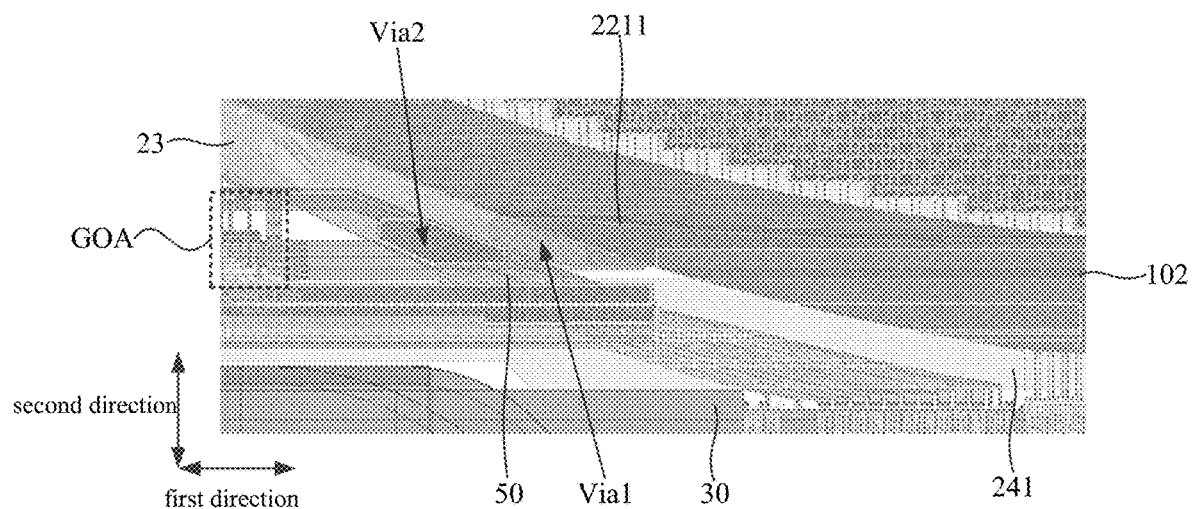
FIG. 9 is a schematic view showing a portion of the display substrate at the lower left corner according to one embodiment of the present disclosure.

As shown in FIGS. 8, 9, 13, 15 and 16, in some embodiments of the present disclosure, the power source line includes a positive power source line 22, the first power source layer includes a first positive power source layer 220, and the second power source layer includes a second positive power source layer 221. At least a part of the first positive power source layer 220 extends in the first direction, the first positive power source layer 220 includes a first middle portion 2202 and two first end portions 2201, the first middle portion 2202 is arranged between the two first end portions 2201 in the first direction, the two first end portions 2201 are symmetrical relative to a central axis 40 of the display substrate extending in the second direction, and the second direction intersects the first direction. As shown in FIG. 8, a maximum width of each first end portion 2201 in the second direction is smaller than a maximum width of the first middle portion 2202 in the second direction.

For example, the power source line includes the positive power source line 22 for transmitting a positive power source signal VDD. The first power source layer includes the first positive power source layer 220, and the second power source layer includes the second positive power source layer 221 coupled to the first positive power source layer 220.

For example, the first positive power source layer 220 includes the first middle portion 2202 and the two first end portions 2201, and the first middle portion 2202 is formed integrally with the two first end portions 2201.

For example, the first middle portion 2202 has a same width or different widths in the second direction.

For example, the first middle portion 2202 is symmetrical relative to the central axis 40 of the display substrate extending in the second direction, and the two first end portions 2201 are symmetrical relative to the central axis 40 of the display substrate extending in the second direction.

Based on the above, when the first positive power source layer 220 includes the first middle portion 2202 and the two first end portions 2201, it is able to effectively reduce a difficulty in the arrangement of the first positive power source layer 220, thereby to ensure the signal transmission uniformity and stability of the positive power source line 22.

Figure 13:
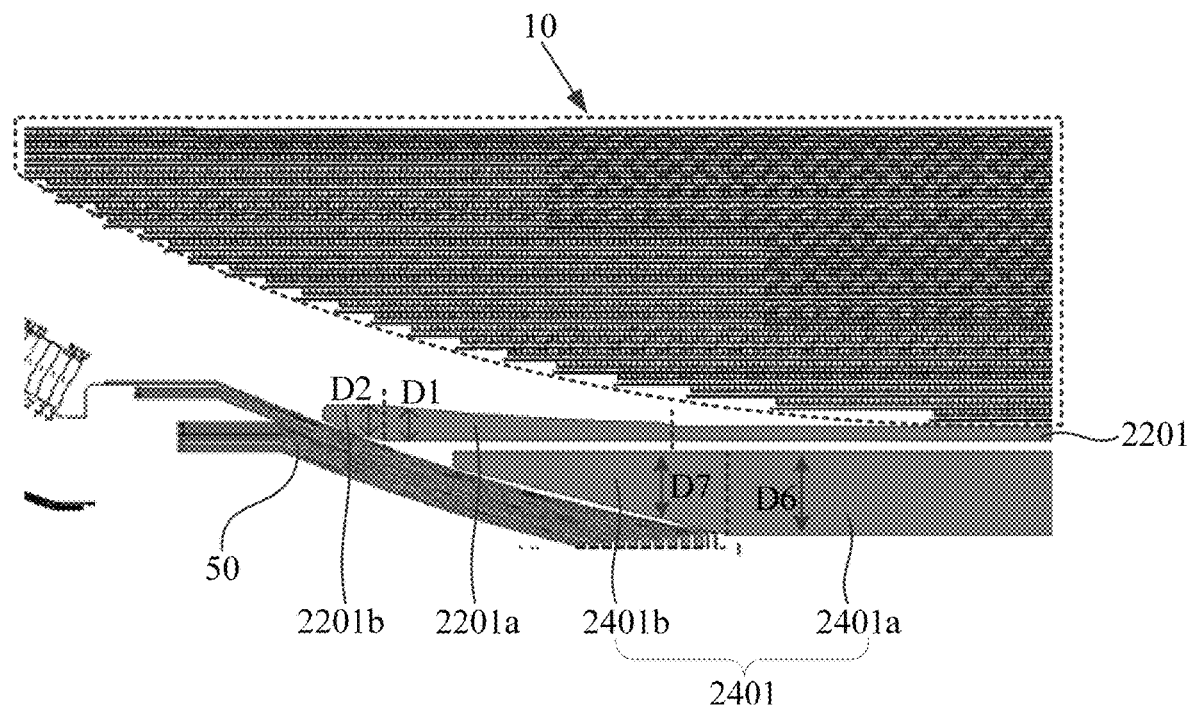
FIG. 13 is a schematic view showing the arrangement of a second gate metal layer at the lower left corner of the display substrate according to one embodiment of the present disclosure.

As shown in FIG. 13, in some embodiments of the present disclosure, each first end portion 2201 includes a first target portion 2201a having a first width D1 in the second direction, and the first width D1 gradually increases in a direction away from the first middle portion 2202.

For example, the first width D1 ranges from 71 μm to 157 μm, with end points inclusive.

Based on the above, when each first end portion 2201 includes the first target portion 2201a, it is able to ensure the excellent connection performance between the first positive power source layer 220 and the second positive power source layer 221, effectively reduce a difficulty in the arrangement of the first positive power source layer 220, and ensure the signal transmission uniformity and stability of the positive power source line 22.

As shown in FIGS. 8 and 13, in some embodiments of the present disclosure, each first end portion 2201 further includes a second target portion 2201b, the first target portion 2201a is arranged between the second target portion 2201b and the first middle portion 2202 in the first direction, the second target portion 2201b has a second width D2 in the second direction, and the second width D2 gradually decreases in the direction away from the first middle portion 2202.

For example, the second target portion 2201b is formed integrally with the first target portion 2201a.

For example, the second width D2 is smaller than or equal to 157 μm.

Based on the above, when the first end portion 2201 further includes the second target portion 2201b, it is able to ensure the excellent connection performance between the first positive power source layer 220 and the second positive power source layer 221, effectively reduce a difficulty in the arrangement of the first positive power source layer 220, and ensure the signal transmission uniformity and stability of the positive power source line 22.

As shown in FIG. 8, in some embodiments of the present disclosure, the non-display region 20 includes a bending region 30, and an orthogonal projection of the first middle portion 2202 onto the base substrate of the display substrate does not overlap an orthogonal projection of the bending region 30 onto the base substrate.

For example, the non-display region 20 includes the bending region 30, and the bending region 30 is arranged at the lower frame of the display substrate and extends in the first direction.

When the orthogonal projection of the first middle portion 2202 onto the base substrate of the display substrate does not overlap the orthogonal projection of the bending region 30 onto the base substrate, it is able to prevent the first middle portion 2202 from being bent, thereby to ensure the reliability of the first middle portion 2202 in a better manner.

As shown in FIGS. 8, 9, 16 and 18, in some embodiments of the present disclosure, the second positive power source layer 221 includes a second middle portion 2210 and two second end portions 2211, at least a part of the second middle portion 2210 is arranged between the two second end portions 2211 in the first direction, and the two second end portions 2211 are symmetrical relative to the central axis 40 of the display substrate extending in the second direction. An orthogonal projection of each second end portion 2211 onto the base substrate of the display substrate at least partially overlaps the orthogonal projection of the first end portion 2201 onto the base substrate, and an orthogonal projection of the second middle portion 2210 onto the base substrate at least partially overlaps the orthogonal projection of the first middle portion 2202 onto the base substrate.

For example, the second positive power source layer 221 includes the second middle portion 2201 and the two second end portions 2211, and the second middle portion 2210 is formed integrally with the two second end portions 2211.

For example, the second middle portion 2210 is symmetrical relative to the central axis 40 of the display substrate extending in the second direction, and the two second end portions 2211 are symmetrical relative to the central axis 40 of the display substrate extending in the second direction.

Based on the above, when the second positive power source layer 221 includes the second middle portion 2210 and the two second end portions 2211, it is able to effectively reduce a difficulty in the arrangement of the second positive power source layer 221, thereby to ensure the signal transmission uniformity and stability of the positive power source line 22.

Figure 16:
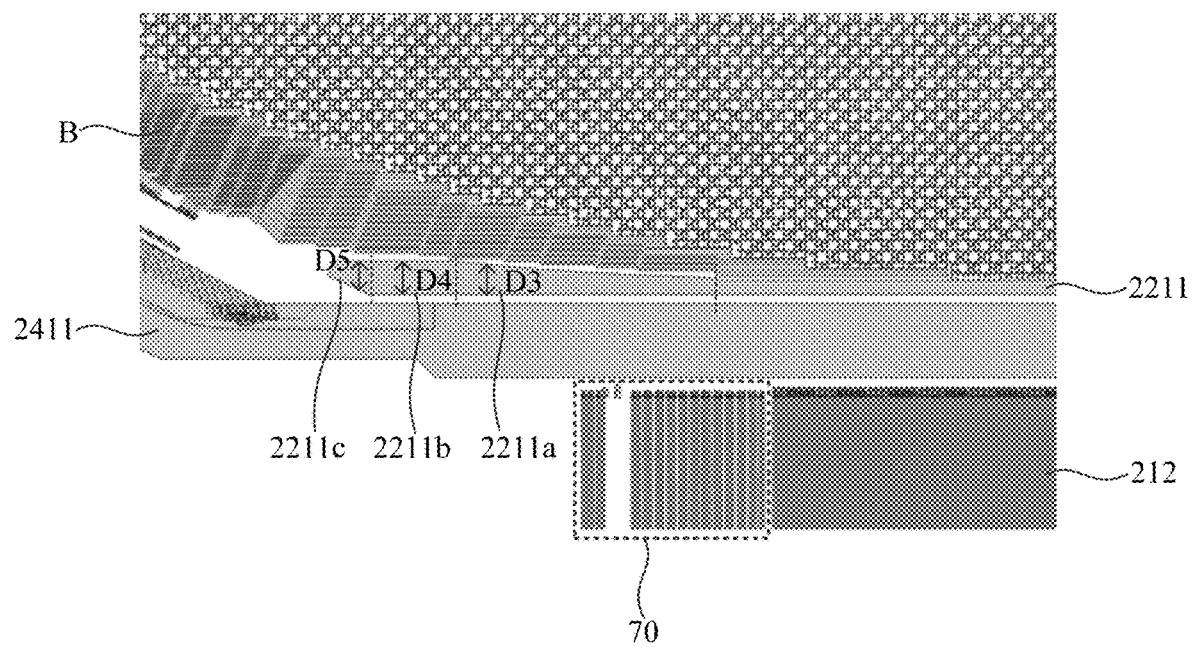
FIG. 16 is a schematic view showing the arrangement of a second source/drain metal layer at the lower left corner of the display substrate according to one embodiment of the present disclosure.
Figure 17:
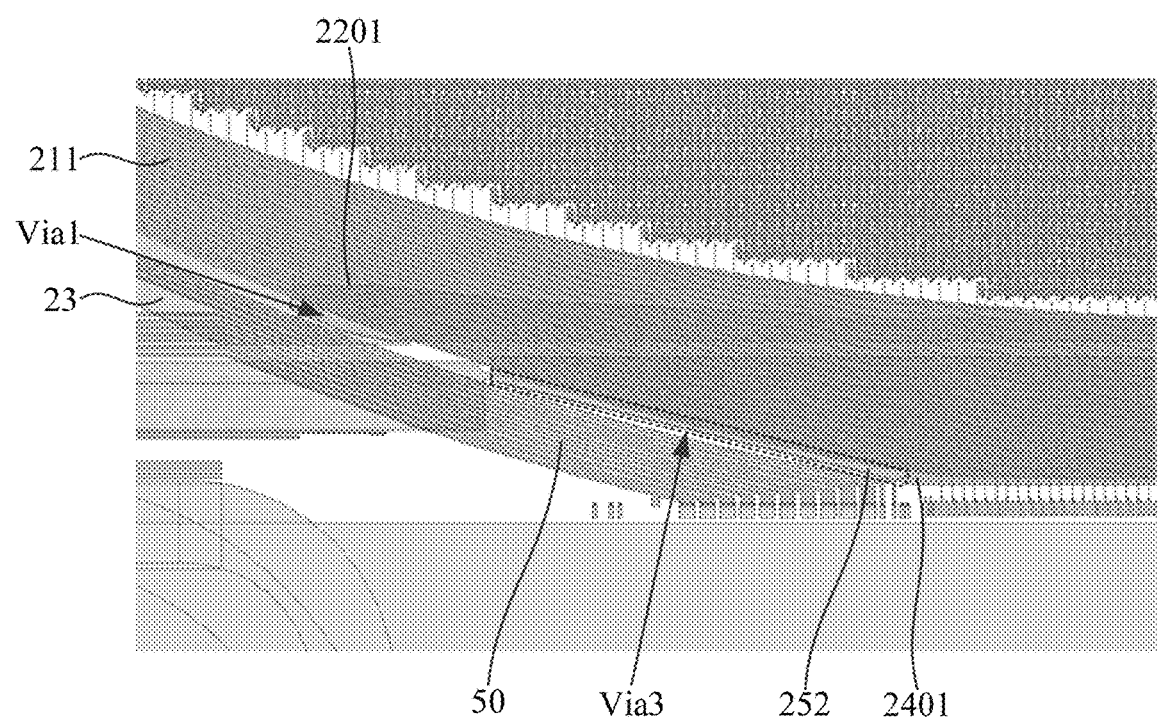
FIG. 17 is a schematic view showing the arrangement of the second gate metal layer and the first source/drain metal layer at the lower left corner of the display substrate according to one embodiment of the present disclosure.
Figure 18:
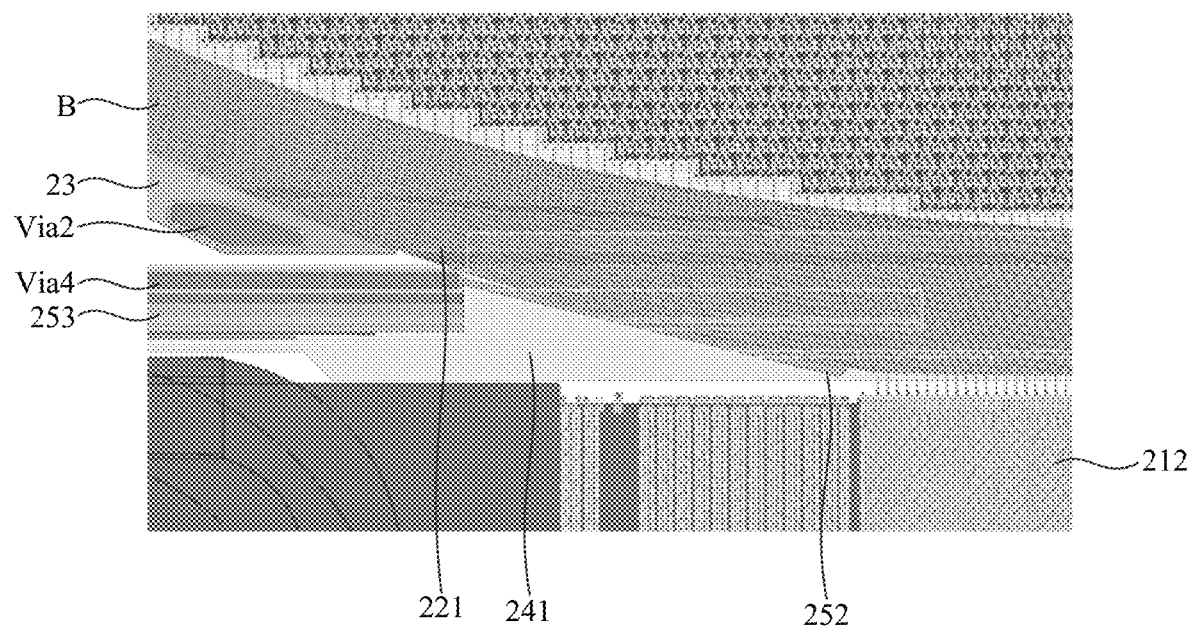
FIG. 18 is a schematic view showing the arrangement of the first source/drain metal layer and the second source/drain metal layer at the lower left corner of the display substrate according to one embodiment of the present disclosure.
Figure 19:
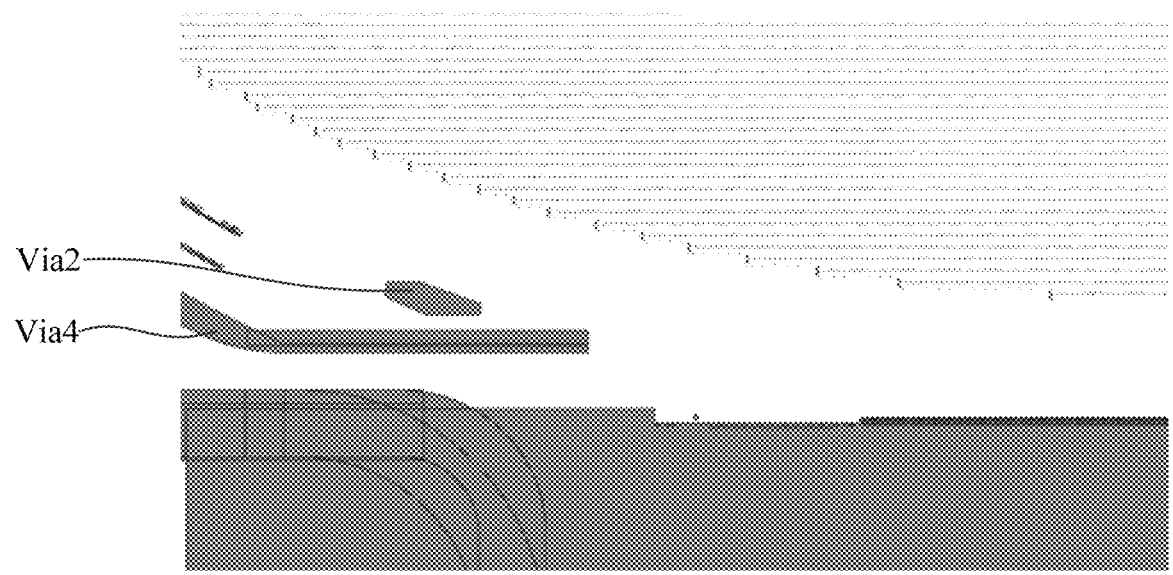
FIG. 19 is a schematic view showing the arrangement of a passivation layer at the lower left corner of the display substrate according to one embodiment of the present disclosure.

As shown in FIG. 16, in some embodiments of the present disclosure, each second end portion 2211 includes a third target portion 2211a having a third width D3 in the second direction, and the third width D3 gradually increases in a direction away from the second middle portion 2210.

For example, the third width D3 ranges from 73 μm to 175 μm, with end points inclusive.

Based on the above, when each second end portion 2211 includes the third target portion 2211a, it is able to ensure the excellent connection performance between the first positive power source layer 220 and the second positive power source layer 221, effectively reduce a difficulty in the arrangement of the second positive power source layer 221, and ensure the signal transmission uniformity and stability of the positive power source line 22.

As shown in FIG. 16, in some embodiments of the present disclosure, each second end portion 2211 further includes a fourth target portion 2211b, the third target portion 2211a is arranged between the fourth target portion 2211b and the second middle portion 2210 in the first direction, and a width D4 of the fourth target portion 2211b in the second direction is equal to a maximum value of the third width D3.

For example, the fourth target portion 2211b has a same width in the second direction.

For example, the width D4 is 175 μm. For another example, the width D4 ranges from 170 μm to 180 μm, with the end points inclusive.

Based on the above, when the second end portion 2211 further includes the fourth target portion 2211b and the width of the fourth target portion 2211b in the second direction is equal to the maximum value of the third width, it is able to ensure the excellent connection performance between the first positive power source layer 220 and the second positive power source layer 221, effectively reduce a difficulty in the arrangement of the second positive power source layer 221, and ensure the signal transmission uniformity and stability of the positive power source line 22.

As shown in FIG. 16, in some embodiments of the present disclosure, each second end portion 2211 further includes a fifth target portion 2211c, the fourth target portion 2211b is arranged between the fifth target portion 2211c and the second middle portion 2210 in the first direction, the fifth target portion 2211c has a fifth width D5 in the second direction, and the fifth width D5 gradually decreases in a direction away from the second middle portion 2210.

For example, the fifth width D5 ranges from 84 μm to 175 μm, with end points inclusive.

For example, the fifth target portion 2211c, the fourth target portion 2211b and the third target portion 2211a are formed integrally.

Based on the above, when the second end portion 2211 further includes the fifth target portion 2211c and the fifth width of the fifth target portion 2211c in the second direction gradually decreases in the direction away from the second middle portion 2210, it is able to ensure the excellent connection performance between the first positive power source layer 220 and the second positive power source layer 221, effectively reduce a difficulty in the arrangement of the second positive power source layer 221, and ensure the signal transmission uniformity and stability of the positive power source line 22.

As shown in FIG. 8, in some embodiments of the present disclosure, the second middle portion includes: a first transmission member 2210a, two ends of which are coupled to the two second end portions 2211 respectively; a second transmission member 2210b, at least a part of which extends in the first direction, the first transmission member 2210a being arranged between the display region and the second transmission member 2210b; at least one connection member 2210c arranged between the first transmission member 2210a and the second transmission member 2210b, and coupled to the first transmission member 2210a and the second transmission member 2210b, an orthogonal projection of the connection member 2210c onto the base substrate of the display substrate at least partially overlapping an orthogonal projection of the bending region 30 of the display substrate onto the base substrate; and two first line inlet members 2210d, at least a part of each first line inlet member 2210d extending in the second direction, the two first line inlet members 2210d being coupled to two ends of the second transmission member 2210b respectively.

For example, the first transmission member 2210a, the second transmission member 2210b, the at least one connection member 2210c and the two first line inlet members 2210d are formed integrally.

Figure 1:
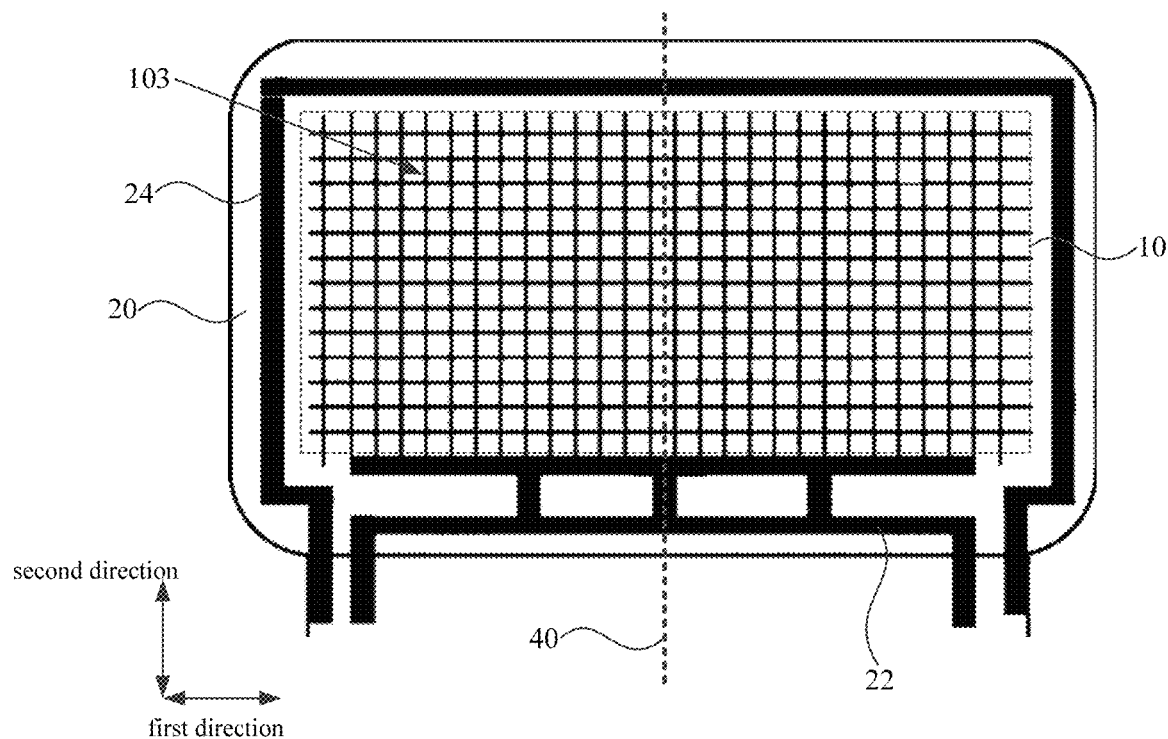
FIG. 1 is a schematic view showing an entire structure of power source lines in a display substrate according to one embodiment of the present disclosure.
Figure 2:
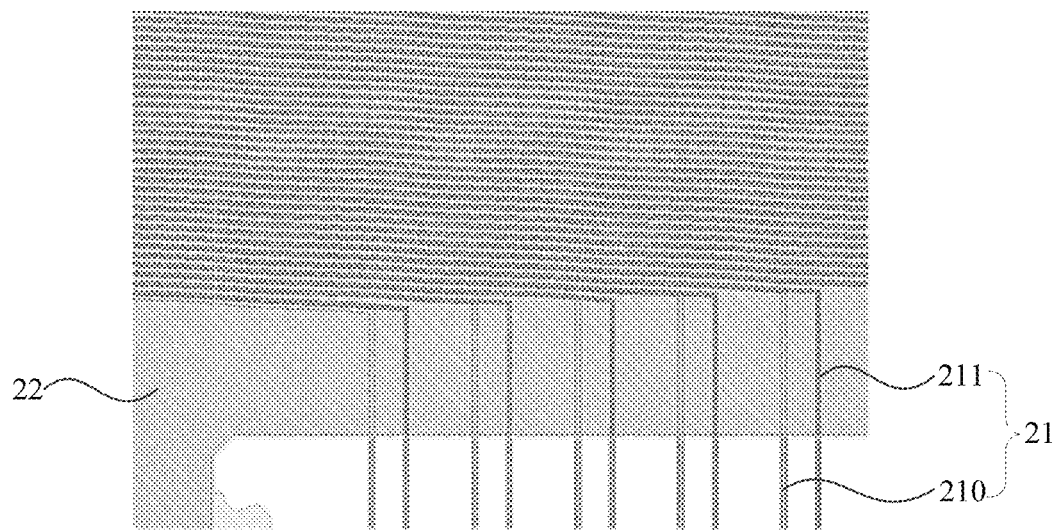
FIG. 2 is a schematic view showing the arrangement of data fanout lines according to one embodiment of the present disclosure.

As shown in FIG. 1, for example, a grid-like power source layer 103 is arranged in the display region of the display substrate, and the first transmission member 2210a is coupled to the grid-like power source layer 103.

For example, a length of the first transmission member 2210a in the first direction is smaller than a length of the second transmission member 2210b in the first direction.

For example, the second middle portion 2210 includes a plurality of connection members 2210c arranged between the first transmission member 2210a and the second transmission member 2210b, and spaced apart from each other in the first direction. Each connection member 2210c is coupled to the first transmission member 2210a and the second transmission member 2210b.

For example, an orthogonal projection of each connection member 2210c onto the base substrate of the display substrate at least partially overlaps the orthogonal projection of the bending region 30 of the display substrate onto the base substrate, and at least a part of each connection member 2210c is bent.

For example, the two first line inlet members 2210d extend in the second direction toward a direction away from the display region, and are coupled to the driving chip so as to receive a positive power source signal from the driving chip.

When the second middle portion 2210 has the above-mentioned structure, it is able to not only ensure the reliability of the second positive power source layer 221 during the bending and ensure the excellent transmission performance of the second positive power source layer 221, but also effectively reduce the difficulty in the arrangement of the second positive power source layer 221 and ensure the signal transmission uniformity and stability of the positive power source line 22.

As shown in FIGS. 8, 9, 15, 17 and 18, in some embodiments of the present disclosure, the conductive connection member includes two first conductive connection members 23 symmetrical relative to the central axis 40, and each first conductive connection member 23 is coupled to the first end portion 2201 and the second end portion 2211.

For example, the two first conductive connection members 23 correspond to the two first end portions 2201 respectively, and correspond to the second two end portions 2211 respectively. Each first conductive connection member 23 is coupled to a corresponding first end portion 2201 and a corresponding second end portion 2211.

Based on the above, when the conductive connection member includes the two first conductive connection members 23, it is able to ensure the excellent connection performance between the first positive power source layer 220 and the second positive power source layer 221, effectively reduce a difficulty in the arrangement of the conductive connection member, and ensure the signal transmission uniformity and stability of the positive power source line 22.

As shown in FIGS. 8, 9, 15, 17 and 18, in some embodiments of the present disclosure, each first conductive connection member 23 extends from the lower frame of the display substrate to a side frame of the display substrate.

For example, in the two first conductive connection members 23, one extends from the lower frame of the display substrate to the left frame of the display substrate, and the other extends from the lower frame of the display substrate to the right frame of the display substrate.

For example, each first conductive connection member 23 extends along a corner of the display region, i.e., it is of an arc-like shape.

Based on the above, it is able to reduce the loading of the power source signal transmitted on the positive power source line 22 in a better manner.

As shown in FIGS. 9, 10, 14, and 17 to 20, in some embodiments of the present disclosure, an orthogonal projection of the first conductive connection member 23 onto the base substrate overlaps an orthogonal projection of the first end portion 2201 onto the base substrate at a first overlapping region, the first conductive connection member 23 is coupled to the first end portion 2201 through a first via-hole Via1, and an orthogonal projection of the first via-hole Via1 onto the base substrate at least partially overlaps the first overlapping region. The orthogonal projection of the first conductive connection member 23 onto the base substrate overlaps an orthogonal projection of the second end portion 2211 onto the base substrate at a second overlapping region, the first conductive connection member 23 is coupled to the second end portion through a second via-hole Via2, and an orthogonal projection of the second via-hole Via2 onto the base substrate at least partially overlaps the second overlapping region.

For example, the first via-hole Via1 penetrates through the interlayer insulation layer, and the second via-hole Via2 penetrates through the passivation layer and the first planarization layer. When the display substrate does not include the passivation layer, the second via-hole Via2 merely penetrates through the first planarization layer.

In some embodiments of the present disclosure, the first via-hole Via1 and the second via-hole Via2 are arranged in the first direction.

Based on the above, it is able to reduce the width of the lower frame of the display substrate.

As shown in FIGS. 9, 10, 14 and 17 to 20, in some embodiments of the present disclosure, the display substrate further includes a plurality of gate driving circuitries GOA and a plurality of first signal lines 50 configured to provide a corresponding signal to a corresponding gate driving circuitry GOA. The orthogonal projection of the first via-hole Via1 onto the base substrate is arranged between an orthogonal projection of the plurality of first signal lines 50 onto the base substrate and an orthogonal projection of the plurality of data fanout lines onto the base substrate, and the orthogonal projection of the second via-hole Via2 onto the base substrate partially overlaps the orthogonal projections of at least a part of the first signal lines 50 onto the base substrate.

For example, the gate driving circuitries GOA are arranged at the left frame and the right frame of the display substrate, and the plurality of first signal lines 50 is arranged at a left side and a right side of the lower frame of the display substrate. Each first signal line 50 is coupled to the driving chip via a connection line. It should be appreciated that, the connection line is located at a position indicated by 70 in FIG. 16, and a touch connection line for transmitting a touch signal may also be arranged at this position. In addition, as shown in FIG. 6, each gate driving circuitry GOA is also configured to provide a scanning signal to the scanning line via a signal transmission line B.

Based on the above, it is able to effectively reduce the width of the lower frame of the display substrate while preventing the occurrence of a short circuit between the positive power source line 22 and the first signal line 50.

As shown in FIGS. 1, 8, 9, 13, 16, 17 and 18, in some embodiments of the present disclosure, the power source line includes a negative power source line 24, the first power source layer includes a first negative power source layer 240, and the second power source layer includes a second negative power source layer 241. The first negative power source layer 240 includes two first negative power source patterns 2401 symmetrical relative to the central axis 40, and at least a part of each first end portion 2201 is arranged between the display region and the first negative power source pattern 2401.

For example, the power source line includes the negative power source line 24 for transmitting a negative power source signal VSS. The first power source layer includes the first negative power source layer 240, and the second power source layer includes the second negative power source layer 241 coupled to the first negative power source layer 240.

For example, an orthogonal projection of at least a part of the first negative power source pattern 2401 onto the base substrate is located between an orthogonal projection of the first signal line 50 onto the base substrate and the orthogonal projection of the first end portion 2201 onto the base substrate.

When the first negative power source layer 240 includes the two first negative power source patterns 2401 symmetrical relative to the central axis 40, it is able to effectively reduce a difficulty in the arrangement of the first negative power source layer 240, and ensure the signal transmission uniformity and stability of the negative power source line 24.

As shown in FIG. 13, in some embodiments of the present disclosure, the first negative power source pattern 2401 includes a sixth target portion 2401a and a seventh target portion 2401b, the sixth target portion 2401a is arranged between the seventh target portion 2401b and the central axis 40, and a width D6 of the sixth target portion 2401a in the second direction is greater than the maximum width (e.g., D2) of the first end portion 2201 in the second direction.

For example, the sixth target portion 2401a is formed integrally with the seventh target portion 2401b.

For example, the sixth target portion 2401a has a same width or different widths in the second direction.

For example, the width D6 is 392 μm. For another example, the width D6 ranges from 387 μm to 397 μm, with the end points inclusive.

When the width of the sixth target portion 2401a in the second direction is greater than the maximum width of the first end portion 2201 in the second direction, it is able to ensure the transmission performance of the negative power source line 24 in a better manner, and reduce the loading of the power source signal transmitted on the negative power source line 24.

As shown in FIG. 13, in some embodiments of the present disclosure, the seventh target portion 2401b has a seventh width D7 in the second direction, and the seventh width D7 gradually decreases in a direction away from the central axis 40.

For example, the seventh width D7 ranges from 73 μm to 392 μm, with the end points inclusive.

Based on the above, it is able to ensure the excellent connection performance between the first negative power source layer 240 and the second negative power source layer 241, effectively reduce the difficulty in the arrangement of the first negative power source pattern 2401, and ensure the signal transmission uniformity and stability of the negative power source line 24.

As shown in FIGS. 8 and 16, in some embodiments of the present disclosure, the second negative power source layer 241 includes: an annular member 2411 surrounding the display region and provided with an opening at the lower frame of the display substrate, at least a part of each second end portion 2211 being arranged between the annular member 2411 and the display region; and two second line inlet members 2412, at least a part of each second line inlet member 2412 extending in the second direction, the two second line inlet members 2412 being coupled to two ends of the annular member 2411 at the opening respectively.

For example, the annular member 2411 is formed integrally with the two second line inlet members 2412.

For example, at least a part of each second line inlet member 2412 extends in the second direction toward a direction away from the display region.

For example, each of the annular member 2411 and the two second line inlet members 2412 is symmetrical relative to the central axis 40.

For example, at least a part of each of the second transmission member 2210b, the first line inlet member 2210d and the connection member 2210c is arranged between the two second line inlet members 2412.

For example, an end of each second line inlet member 2412 away from the display region is coupled to the driving chip so as to receive the negative power source signal from the driving chip.

When the second negative power source layer 241 has the above-mentioned structure, it is able to reduce the difficulty in the arrangement of the negative power source line 24, and ensure the signal transmission stability and uniformity of the negative power source line 24.

As shown in FIG. 8, in some embodiments of the present disclosure, each second line inlet member 2412 is provided with a hole 2412a, and an orthogonal projection of the hole 2412a onto the base substrate of the display substrate at least partially overlaps the orthogonal projection of the bending region 30 of the display substrate onto the base substrate.

Based on the above, it is able to ensure the reliability of the second line inlet member 2412 when it is bent at the bending region 30 in a better manner.

As shown in FIGS. 8, 9, 15, 17 and 18, in some embodiments of the present disclosure, the conductive connection member includes a second conductive connection member 25 surrounding the display region, provided with an opening at the lower frame of the display substrate, and coupled to the first negative power source layer 240 and the second negative power source layer 241.

For example, the second conductive connection member 25 is symmetrical relative to the central axis 40.

Based on the above, it is able to ensure the connection performance between the first negative power source layer 240 and the second negative power source layer 241 in a better manner, thereby to ensure the signal transmission uniformity and stability of the negative power source line 24.

As shown in FIGS. 9 and 13 to 20, in some embodiments of the present disclosure, the second conductive connection member 25 includes an annular portion 251, two first portions 252 and two second portions 253. At least a part of the display region is surrounded by the annular portion 251, two ends of the annular portion 251 are coupled to first ends of the two second portions 253 respectively, second ends of the two second portions 253 are coupled to the two first portions 252 respectively, and the opening of the second conductive connection member 25 is formed between the two first portions 252.

As shown in FIGS. 9, 13, 15 and 17, an extension direction of each first portion 252 intersects the first direction and the second direction, an orthogonal projection of the first portion 252 onto the base substrate of the display substrate overlaps an orthogonal projection of the first negative power source layer 240 onto the base substrate at a third overlapping region, the first portion 252 is coupled to the first negative power source layer 240 through a third via-hole Via3, and an orthogonal projection of the third via-hole Via3 onto the base substrate at least partially overlaps the third overlapping region.

As shown in FIGS. 9, 15, 16, and 18 to 20, at least a part of each second portion 253 extends in the first direction, an orthogonal projection of the second portion 253 onto the base substrate and/or an orthogonal projection of the annular portion onto the base substrate overlap an orthogonal projection of the second negative power source layer 241 onto the base substrate at a fourth overlapping region, the second portion 253 and/or the annular portion are coupled to the second negative power source layer 241 through a fourth via-hole Via4, and an orthogonal projection of the fourth via-hole Via4 onto the base substrate at least partially overlaps the fourth overlapping region.

For example, the annular portion 251, the two first portions 252 and the two second portions 253 are formed integrally.

For example, the annular portion 251 is symmetrical relative to the central axis 40, the two first portions 252 are symmetrical relative to the central axis 40, and the two second portions 253 are symmetrical relative to the central axis 40.

For example, the annular portion 251 is opened at the lower frame of the display substrate, i.e., it is provided with two end portions. For example, the two first portions 252 are not directly coupled to each other, and the opening of the second conductive connection member 25 is formed between the two first end portions 252.

For example, the third via-hole Via3 penetrates through the interlayer insulation layer, and the fourth via-hole Via4 penetrates through the passivation layer and the first planarization layer. For example, when the display substrate does not include the passivation layer, the fourth via-hole Via4 merely penetrates through the first planarization layer.

For example, at least a part of an orthogonal projection of the fourth via-hole Via4 onto the base substrate extends in the first direction. For example, at least a part of the orthogonal projection of the fourth via-hole Via4 onto the base substrate extends along the corner of the display substrate.

When the second conductive connection member 25 has the above-mentioned structure, it is able to ensure the connection performance between the first negative power source layer 240 and the second negative power source layer 241 in a better manner, thereby to ensure the signal transmission uniformity and stability of the negative power source line 24.

Figure 14:
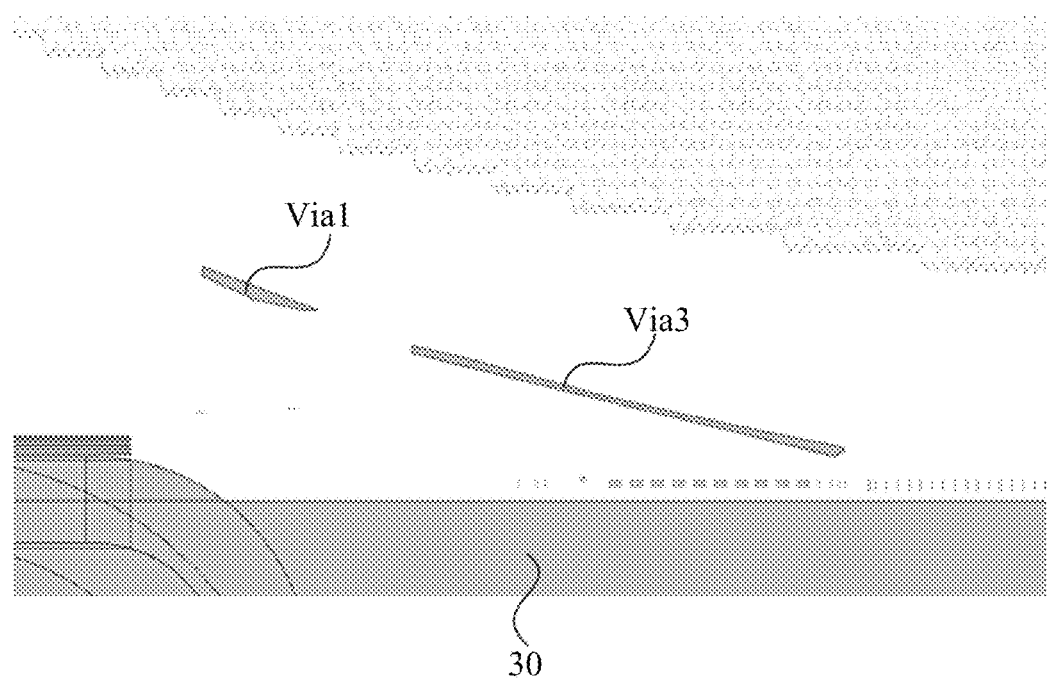
FIG. 14 is a schematic view showing the arrangement of an interlayer insulation layer at the lower left corner of the display substrate according to one embodiment of the present disclosure.
Figure 15:
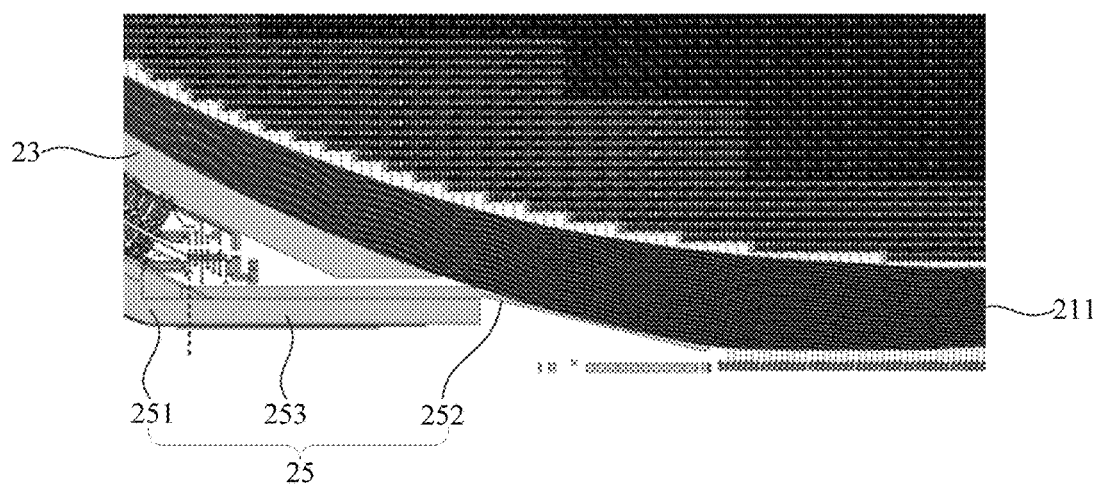
FIG. 15 is a schematic view showing the arrangement of a first source/drain metal layer at the lower left corner of the display substrate according to one embodiment of the present disclosure.

As shown in FIG. 14, in some embodiments of the present disclosure, an extension direction of the orthogonal projection of the third via-hole Via3 onto the base substrate intersects the first direction and the second direction.

Based on the above, it is able to reduce the difficulty in the arrangement of the negative power source line 24 and the second conductive connection member 25, and ensure the connection performance between the first negative power source layer 240 and the second negative power source layer 241 in a better manner.

The present disclosure further provides in some embodiments a display device including the above-mentioned display substrate.

According to the display substrate in the embodiments of the present disclosure, the plurality of data fanout lines includes the plurality of first data fanout lines 210 and the plurality of second data fanout lines 211, the first data fanout lines 210 are arranged at a same layer, and made of a same material, as the scanning lines 101, and the second data fanout lines 211 are arranged at a same layer, and made of a same material, as the data lines 102, so that the first data fanout line 210 is arranged at a layer different from the second data fanout line 211. As a result, through reducing a distance between the orthogonal projection of the first data fanout line 210 onto the base substrate and an orthogonal projection of the second data fanout line 211 onto the base substrate, it is able to reduce an overall space occupied by the plurality of data fanout lines, and reduce an overall width of the plurality of data fanout lines in the second direction, thereby to effectively reduce a width of the lower frame of the display substrate, and improve the competitiveness of a display product including the display substrate.

Hence, when the display device includes the above-mentioned display substrate, it also has the above-mentioned beneficial effects, which will not be particularly defined herein.

It should be appreciated that, the display device may be any product or member having a display function, e.g., a television, a display, a digital photo frame, a mobile phone or a tablet computer.

The present disclosure further provides in some embodiments a method for manufacturing the above-mentioned display substrate. The display substrate includes a display region and a non-display region 20 surrounding the display region. The method includes forming a plurality of scanning lines 101, a plurality of data lines 102 and a plurality of data fanout lines. At least a part of each scanning line 101 is arranged at the display region, at least a part of each data line 102 is arranged at the display region, and at least a part of each data fanout line is arranged at the non-display region 20. Each data fanout line 21 is coupled to a corresponding data line 102, the plurality of data fanout lines 21 includes a plurality of first data fanout lines 210 and a plurality of second data fanout lines 211, the first data fanout lines 210 are arranged at a same layer, and made of a same material, as the scanning lines 101, and the second data fanout lines 211 are arranged at a same layer, and made of a same material, as the data lines 102.

For example, the plurality of data fanout lines includes a plurality of first data fanout lines 210 arranged evenly and a plurality of second data fanout lines 211 arranged evenly. The first data fanout lines 210 are arranged at a same layer, and made of a same material, as the scanning lines 101, so that the first data fanout lines 210 and the scanning lines 101 are formed through a single patterning process. Identically, the second data fanout lines 211 are arranged at a same layer, and made of a same material, as the data lines 102, so that the second data fanout lines 211 and the data lines 102 are formed through a single patterning process. In this way, it is able to simplify a manufacture process of the display substrate in a better manner, thereby to reduce the manufacture cost of the display substrate.

According to the display substrate manufactured through the method in the embodiments of the present disclosure, the plurality of data fanout lines includes the plurality of first data fanout lines 210 and the plurality of second data fanout lines 211, the first data fanout lines 210 are arranged at a same layer, and made of a same material, as the scanning lines 101, and the second data fanout lines 211 are arranged at a same layer, and made of a same material, as the data lines 102, so that the first data fanout line 210 is arranged at a layer different from the second data fanout line 211. As a result, through reducing a distance between the orthogonal projection of the first data fanout line 210 onto the base substrate and an orthogonal projection of the second data fanout line 211 onto the base substrate, it is able to reduce an overall space occupied by the plurality of data fanout lines, and reduce an overall width of the plurality of data fanout lines in the second direction, thereby to effectively reduce a width of the lower frame of the display substrate, and improve the competitiveness of a display product including the display substrate.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a display region and a non-display region surrounding the display region,
   wherein the display substrate further comprises: a plurality of scanning lines, at least a part of each scanning line being located at the display region; a plurality of data lines, at least a part of each data line being located at the display region; and a plurality of data fanout lines, at least a part of each data fanout line being located at the non-display region,
   wherein each data fanout line is coupled to a corresponding data line, the plurality of data fanout lines comprises a plurality of first data fanout lines and a plurality of second data fanout lines, the first data fanout lines are arranged at a same layer, and made of a same material, as the scanning lines, and the second data fanout lines are arranged at a same layer, and made of a same material, as the data lines;
   wherein the display substrate further comprises a power source line comprising a first power source layer, wherein the first data fanout lines, at least a part of the first power source layer and the second data fanout lines are sequentially laminated one on another in a direction perpendicular to a base substrate of the display substrate, and the first data fanout lines, at least a part of the first power source layer and the second data fanout lines are arranged at different layers respectively.

2. The display substrate according to claim 1, wherein orthogonal projections of at least a part of the first data fanout lines onto a base substrate of the display substrate at least partially overlap orthogonal projections of the second data fanout lines onto the base substrate.

3. The display substrate according to claim 2, wherein each of at least a part of the first data fanout lines comprises a first line segment, each of at least a part of the second data fanout lines comprises a second line segment, and an orthogonal projection of the first line segment onto the base substrate coincides with an orthogonal projection of the second line segment onto the base substrate.

4. A display substrate, comprising a display region and a non-display region surrounding the display region,
wherein the display substrate further comprises: a plurality of scanning lines, at least a part of each scanning line being located at the display region; a plurality of data lines, at least a part of each data line being located at the display region; and a plurality of data fanout lines, at least a part of each data fanout line being located at the non-display region,
wherein each data fanout line is coupled to a corresponding data line, the plurality of data fanout lines comprises a plurality of first data fanout lines and a plurality of second data fanout lines, the first data fanout lines are arranged at a same layer, and made of a same material, as the scanning lines, and the second data fanout lines are arranged at a same layer, and made of a same material, as the data lines;
wherein the display substrate further comprises a power source line comprising a first power source layer, wherein the first data fanout lines, at least a part of the first power source layer and the second data fanout lines are sequentially laminated one on another in a direction perpendicular to a base substrate of the display substrate, and the first data fanout lines, at least a part of the first power source layer and the second data fanout lines are arranged at different layers respectively;
wherein the power source line further comprises a second power source layer coupled to the first power source layer, at least a part of the first power source layer and at least a part of the second power source layer are arranged at the non-display region, the first power source layer and the second power source layer are arranged at different layers, and the base substrate of the display substrate, at least a part of the first power source layer and the second power source layer are sequentially laminated one on another in the direction perpendicular to the base substrate of the display substrate, and the base substrate of the display substrate, at least a part of the first power source layer and the second power source layer are arranged at different layers respectively.

5. The display substrate according to claim 4, wherein the first power source layer, at least a part of the second data fanout lines and the second power source layer are sequentially laminated one on another in the direction perpendicular to the base substrate of the display substrate, and the first power source layer, at least a part of the second data fanout lines and the second power source layer are arranged at different layers respectively.

6. The display substrate according to claim 4, further comprising a conductive connection member, wherein at least a part of the conductive connection member is arranged between the first power source layer and the second power source layer, and the conductive connection member is coupled to the first power source layer and the second power source layer.

7. The display substrate according to claim 6, comprising a first gate metal layer, a second gate metal layer, a first source/drain metal layer and a second source/drain metal layer laminated one on another in a direction away from the base substrate of the display substrate, wherein each scanning line is arranged at a same layer, and made of a same material, as the first gate metal layer, each data line is arranged at a same layer, and made of a same material, as the first source/drain metal layer, the first power source layer is arranged at a same layer, and made of a same material, as the second gate metal layer, the second power source layer is arranged at a same layer, and made of a same material, as the second source/drain metal layer, and the conductive connection member is arranged at a same layer, and made of a same material, as the first source/drain metal layer.

8. A display substrate, comprising a display region and a non-display region surrounding the display region,
wherein the display substrate further comprises: a plurality of scanning lines, at least a part of each scanning line being located at the display region; a plurality of data lines, at least a part of each data line being located at the display region; and a plurality of data fanout lines, at least a part of each data fanout line being located at the non-display region,
wherein each data fanout line is coupled to a corresponding data line, the plurality of data fanout lines comprises a plurality of first data fanout lines and a plurality of second data fanout lines, the first data fanout lines are arranged at a same layer, and made of a same material, as the scanning lines, and the second data fanout lines are arranged at a same layer, and made of a same material, as the data lines;
wherein the display substrate further comprises a power source line comprising a first power source layer and a second power source layer coupled to the first power source layer;
wherein the power source line comprises a positive power source line, the first power source layer comprises a first positive power source layer, and the second power source layer comprises a second positive power source layer;
at least a part of the first positive power source layer extends in a first direction, the first positive power source layer comprises a first middle portion and two first end portions, the first middle portion is arranged between the two first end portions in the first direction, the two first end portions are symmetrical relative to a central axis of the display substrate extending in a second direction, and the second direction intersects the first direction; and
a maximum width of each first end portion in the second direction is smaller than a maximum width of the first middle portion in the second direction.

9. The display substrate according to claim 8, wherein each first end portion comprises a first target portion having a first width in the second direction, and the first width gradually increases in a direction away from the first middle portion.

10. The display substrate according to claim 9, wherein each first end portion further comprises a second target portion, the first target portion is arranged between the second target portion and the first middle portion in the first direction, the second target portion has a second width in the second direction, and the second width gradually decreases in the direction away from the first middle portion.

11. The display substrate according to claim 8, wherein the second positive power source layer comprises a second middle portion and two second end portions, at least a part of the second middle portion is arranged between the two second end portions in the first direction, and the two second end portions are symmetrical relative to the central axis of the display substrate extending in the second direction, wherein an orthogonal projection of each second end portion onto the base substrate of the display substrate at least partially overlaps the orthogonal projection of the first end portion onto the base substrate, and an orthogonal projection of the second middle portion onto the base substrate at least partially overlaps the orthogonal projection of the first middle portion onto the base substrate;

wherein each second end portion comprises a third target portion having a third width in the second direction, and the third width gradually increases in a direction away from the second middle portion;

wherein each second end portion further comprises a fourth target portion, the third target portion is arranged between the fourth target portion and the second middle portion in the first direction, and a width of the fourth target portion in the second direction is equal to a maximum value of the third width;

wherein each second end portion further comprises a fifth target portion, the fourth target portion is arranged between the fifth target portion and the second middle portion in the first direction, the fifth target portion has a fifth width in the second direction, and the fifth width gradually decreases in a direction away from the second middle portion.

12. The display substrate according to claim 11, wherein the second middle portion comprises: a first transmission member, two ends of which are coupled to the two second end portions respectively; a second transmission member, at least a part of which extends in the first direction, the first transmission member being arranged between the display region and the second transmission member; at least one connection member arranged between the first transmission member and the second transmission member, and coupled to the first transmission member and the second transmission member, an orthogonal projection of the connection member onto the base substrate of the display substrate at least partially overlapping an orthogonal projection of a bending region of the display substrate onto the base substrate; and two first line inlet members, at least a part of each first line inlet member extending in the second direction, the two first line inlet members being coupled to two ends of the second transmission member respectively.

13. The display substrate according to claim 11, wherein the conductive connection member comprises two first conductive connection members symmetrical relative to the central axis, and each first conductive connection member is coupled to the first end portion and the second end portion;

wherein each first conductive connection member extends from a lower frame of the display substrate to a side frame of the display substrate.

14. The display substrate according to claim 13, wherein an orthogonal projection of each first conductive connection member onto the base substrate overlaps an orthogonal projection of the first end portion onto the base substrate at a first overlapping region, the first conductive connection member is coupled to the first end portion through a first via-hole, and an orthogonal projection of the first via-hole onto the base substrate at least partially overlaps the first overlapping region, wherein the orthogonal projection of the first conductive connection member onto the base substrate overlaps an orthogonal projection of the second end portion onto the base substrate at a second overlapping region, the first conductive connection member is coupled to the second end portion through a second via-hole, and an orthogonal projection of the second via-hole onto the base substrate at least partially overlaps the second overlapping region;

wherein the first via-hole and the second via-hole are arranged in the first direction.

15. The display substrate according to claim 14, further comprising a plurality of gate driving circuitries and a plurality of first signal lines configured to provide a corresponding signal to a corresponding gate driving circuitry, wherein the orthogonal projection of the first via-hole onto the base substrate is arranged between an orthogonal projection of the plurality of first signal lines onto the base substrate and an orthogonal projection of the plurality of data fanout lines onto the base substrate, and the orthogonal projection of the second via-hole onto the base substrate partially overlaps the orthogonal projections of at least a part of the first signal lines onto the base substrate.

16. The display substrate according to claim 11, wherein the power source line comprises a negative power source line, the first power source layer comprises a first negative power source layer, and the second power source layer comprises a second negative power source layer, wherein the first negative power source layer comprises two first negative power source patterns symmetrical relative to the central axis, and at least a part of each first end portion is arranged between the display region and the first negative power source pattern.

17. The display substrate according to claim 16, wherein each first negative power source pattern comprises a sixth target portion and a seventh target portion, the sixth target portion is arranged between the seventh target portion and the central axis, and a width of the sixth target portion in the second direction is greater than the maximum width of the first end portion in the second direction;

wherein the seventh target portion has a seventh width in the second direction, and the seventh width gradually decreases in a direction away from the central axis; and/or;

wherein the second negative power source layer comprises: an annular member surrounding the display region and provided with an opening at a lower frame of the display substrate, at least a part of each second end portion being arranged between the annular member and the display region; and two second line inlet members, at least a part of each second line inlet member extending in the second direction, the two second line inlet members being coupled to two ends of the annular member at the opening respectively;

wherein each second line inlet member is provided with a hole, and an orthogonal projection of the hole onto the base substrate of the display substrate at least partially overlaps an orthogonal projection of a bending region of the display substrate onto the base substrate.

18. The display substrate according to claim 16, wherein the conductive connection member comprises a second conductive connection member surrounding the display region, provided with an opening at a lower frame of the display substrate, and coupled to the first negative power source layer and the second negative power source layer;

wherein the second conductive connection member comprises an annular portion, two first portions and two second portions;

at least a part of the display region is surrounded by the annular portion, two ends of the annular portion are coupled to first ends of the two second portions respectively, second ends of the two second portions are coupled to the two first portions respectively, and the opening of the second conductive connection member is formed between the two first portions;

an extension direction of each first portion intersects the first direction and the second direction, an orthogonal projection of the first portion onto the base substrate of the display substrate overlaps an orthogonal projection of the first negative power source layer onto the base substrate at a third overlapping region, the first portion is coupled to the first negative power source layer through a third via-hole, and an orthogonal projection of the third via-hole onto the base substrate at least partially overlaps the third overlapping region; and at least a part of each second portion extends in the first direction, an orthogonal projection of the second portion onto the base substrate and/or an orthogonal projection of the annular portion onto the base substrate overlap an orthogonal projection of the second negative power source layer onto the base substrate at a fourth overlapping region, the second portion and/or the annular portion are coupled to the second negative power source layer through a fourth via-hole, and an orthogonal projection of the fourth via-hole onto the base substrate at least partially overlaps the fourth overlapping region;

wherein an extension direction of the orthogonal projection of the third via-hole onto the base substrate intersects the first direction and the second direction.

19. A display device, comprising the display substrate according to claim 1.

20. The display substrate according to claim 8, wherein the non-display region comprises a bending region, and an orthogonal projection of the first middle portion onto the base substrate of the display substrate does not overlap an orthogonal projection of the bending region onto the base substrate.

* * * * *